United States Patent
Ayranci et al.

(10) Patent No.: US 12,191,819 B2
(45) Date of Patent: Jan. 7, 2025

(54) HYBRID INPUT LNA RF FRONTEND ARCHITECTURE

(71) Applicant: Murata Manufacturing Co., Ltd., Nagaokakyo (JP)

(72) Inventors: Emre Ayranci, Costa Mesa, CA (US); Miles Sanner, San Diego, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 441 days.

(21) Appl. No.: 17/523,584

(22) Filed: Nov. 10, 2021

(65) Prior Publication Data

US 2023/0147703 A1 May 11, 2023

(51) Int. Cl.
*H03F 1/22* (2006.01)
*H03F 1/56* (2006.01)
*H03F 3/19* (2006.01)

(52) U.S. Cl.
CPC ............... *H03F 3/19* (2013.01); *H03F 1/565* (2013.01); *H03F 2200/165* (2013.01); *H03F 2200/222* (2013.01); *H03F 2200/294* (2013.01); *H03F 2200/451* (2013.01)

(58) Field of Classification Search
CPC ............... H03F 1/22; H03F 3/191; H03F 1/12
USPC .......................................... 330/311, 302, 51
See application file for complete search history.

(56) References Cited

U.S. PATENT DOCUMENTS

| | | | |
|---|---|---|---|
| 10,461,704 B2 | 10/2019 | Shah et al. | |
| 10,771,025 B1 * | 9/2020 | Ayranci | H03F 3/68 |
| 11,817,829 B2 * | 11/2023 | Padyana | H04B 1/16 |
| 2006/0189286 A1 | 8/2006 | Kyu et al. | |
| 2015/0381124 A1 | 12/2015 | Joly et al. | |
| 2019/0103843 A1 | 4/2019 | Aikawa | |
| 2020/0127617 A1 | 4/2020 | Shah et al. | |
| 2020/0266778 A1 * | 8/2020 | Ayranci | H03F 3/45188 |
| 2021/0067115 A1 * | 3/2021 | Karmaker | H03F 3/45264 |
| 2021/0143779 A1 | 5/2021 | Ayranci et al. | |

OTHER PUBLICATIONS

International Search Report and Written Opinion issued for International PCT Application No. PCT/US2022/079467 filed on Nov. 8, 2022 on behalf of pSemi Corporation. Mail Date: Mar. 20, 2023. 9 pages.

* cited by examiner

*Primary Examiner* — Henry Choe
(74) *Attorney, Agent, or Firm* — Steinfl + Bruno LLP

(57) ABSTRACT

Methods and devices for realizing RF processing paths associated to different frequency bands are presented. According to one aspect, the RF processing paths are provided by a hybrid input LNA RF frontend that includes RF processing paths that are dedicated to specific frequency bands and RF processing paths that are shared between several frequency bands. Sharing of the RF processing paths is provided by an input combiner network and/or a multi-input cascode amplifier that includes a cascode transistor that is coupled to at least two input transistors. Further presented in a toolkit that includes circuit blocks that can be used in specific combinations to customize the RF processing paths to achieve specific performance or cost optimization. A decision tree based on performance and cost priorities assigned to each of the frequency bands is used to provide the specific combinations.

21 Claims, 17 Drawing Sheets

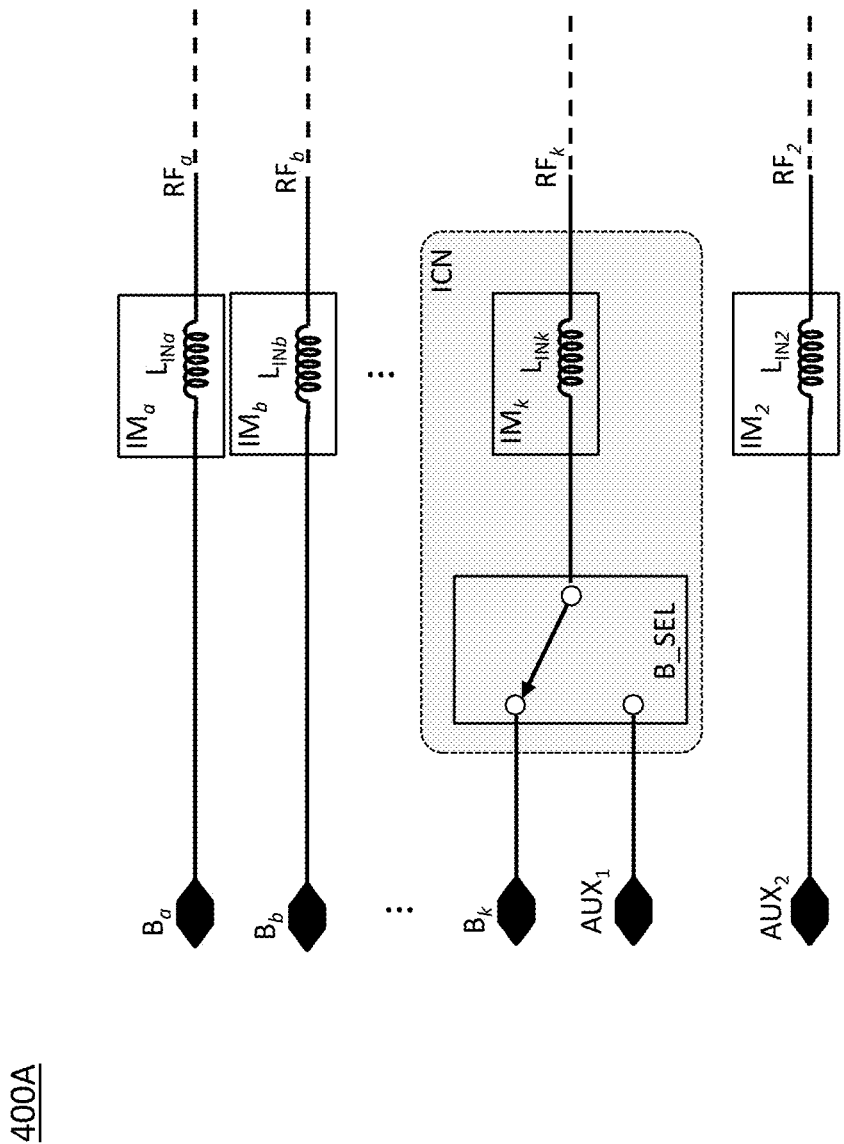

HYBRID INPUT LNA RF FRONTEND ARCHITECTURE

TECHNICAL FIELD

The present disclosure is related to electronic radio frequency (RF) circuits, and more particularly to a hybrid input architecture of an RF frontend (RFFE) that considers different input performance priorities to optimize performance and cost of the RFFE.

BACKGROUND

Processing of an input RF signal through an RF system (e.g., RFFE) may be provided via a combination of switches, filters and matching circuits, coupled to an amplifier, which in combination may provide an RF processing path for amplification of the input RF signal. In a traditional RFFE architecture used in, for example, a handheld device, different input RF signals corresponding to different frequency bands may require different RF processing paths. When designing an RFFE module, circuit designers may be required to take into consideration cost versus performance tradeoff of the RFFE module while supporting the different frequency bands.

FIG. 1A shows a prior art RFFE (receive side) architecture (100A) that reduces cost by providing a combined amplification path, CAP, for processing of all of the supported frequency bands. Such frequency bands may include a plurality of (over-the-air) frequency bands (e.g., $B_a, B_b, \ldots, B_k$) and one or more auxiliary frequency bands (e.g., $AUX_1, AUX_2$). An RF signal corresponding to each of the frequency bands (e.g., $B_a, B_b, \ldots, B_k$) is received at the antenna, ANT, and is selectively routed through a respective filter (e.g., a, b, . . . , k) of a filter bank, FB, via an antenna switch, ASW. A switch, B_SEL, selectively couples one of the supported frequency bands (e.g., $B_a, B_b, \ldots, B_k$, AUX), $AUX_2$ coupled to respective throws of the switch B_SEL) to the combined amplification path, CAP (e.g. coupled to the single pole of the switch B_SEL). For example, as shown in FIG. 1A, the switch, B_SEL, may couple an RF signal, $RF_{SEL}$, corresponding to the selected frequency band, $B_a$, to an input matching circuit, IM, of the combined amplification path, CAP. In turn, an amplifier, AP, and an output matching circuit, OM, of the combined amplification path, CAP, may further process the RF signal, $RF_{SEL}$, for output of an amplified output RF signal, $RF_{OUT}$.

The prior art RFFE architecture (100A) of FIG. 1A reduces cost of a corresponding RFFE module by reducing a number of components required for processing of the supported frequency bands (e.g., $B_a, B_b, \ldots, B_k, AUX_1, AUX_2$). In particular, use of the combined amplification path, CAP, allows processing of the supported frequency bands via a single input matching circuit, IM, and a single amplifier, AP. Such reduction in the number of components may allow for a reduction in die area, and therefore a (physical) size, of a corresponding RFFE module. On the other hand, an insertion loss (inherent) of the switch, B_SEL, may degrade a noise figure (NF) performance of the RFFE architecture (100A) with respect to all of the supported frequency bands. Furthermore, use of a same input match, IM, and amplifier, AP, may reduce flexibility in optimizing a performance (e.g., matching, gain, power, linearity, etc.) of the RFFE architecture (100A) with respect to a specific frequency band of the supported frequency bands (e.g., $B_a, B_b, \ldots, B_k, AUX_1, AUX_2$). Such performance shortcoming may be addressed by the prior art RFFE architecture (100B) of FIG. 1B.

The prior art RFFE architecture (100B) of FIG. 1B increases performance of a corresponding RFFE module by providing a dedicated RF amplification path (e.g., $DAP_a, DAP_b, \ldots, DAP_k, DAP_1, DAP_2$) for each of the supported frequency bands (e.g., $B_a, B_b, \ldots, B_k, AUX_1, AUX_2$). Use of such dedicated amplification paths (e.g., $DAP_a, DAP_b, \ldots, DAP_k, DAP_1, DAP_2$, coupled to a same output matching circuit, OM) may remove requirement for the switch, B_SEL, of the RFFE architecture (100A) of FIG. 1A, and therefore may improve a noise figure (NF) performance of the RFFE architecture (100B). Furthermore, a dedicated input matching circuit (e.g., $IM_a, IM_b, \ldots, IM_k, IM_1, IM_2$ of a bank of input matching circuits, IMB) and a dedicated amplifier (e.g., $AP_a, AP_b, \ldots, AP_k, AP_1, AP_2$ of a bank of amplifiers, APB) of the dedicated RF amplification paths (e.g., $DAP_a, DAP_b, \ldots, DAP_k, DAP_1, DAP_2$) may allow increased flexibility in optimizing a performance (e.g., matching, gain, power, linearity, etc.) of the RFFE architecture (100B) with respect to a specific frequency band of the supported frequency bands (e.g., $B_a, B_b, \ldots, B_k, AUX_1, AUX_2$).

The increased performance provided by the prior art RFFE architecture (100B) of FIG. 1B over the prior art RFFE architecture (100A) of FIG. 1A may be associated to an increased cost of components used in the dedicated RF amplification paths (e.g., $DAP_a, DAP_b, \ldots, DAP_k, DAP_1, DAP_2$) and an increase in die area, and therefore a (physical) size and cost, of a corresponding RFFE module.

Based on the above, it would be clear to a person skilled in the art, that the prior art architectures (100A, 100B) provide a binary choice between optimizing a performance or a cost of a corresponding RFFE module when considered globally. Teachings according to the present disclosure provide circuit designers and/or system integrators tools that allow flexibility in choice between optimizing a performance or a cost of each individual RF processing path of different frequency bands supported by an RFFE module. Accordingly, by deploying such tools based on specific performance priorities of corresponding input RF signals of the supported frequency bands, performance and cost of the RFFE module may be simultaneously optimized.

SUMMARY

According to a first aspect of the present disclosure, a multi-input multi-band low noise amplifier (LNA) is presented, comprising: a dedicated RF processing path for processing of an input RF signal of a first frequency band, the dedicated RF processing path comprising: a dedicated cascode amplifier comprising a dedicated input transistor and a dedicated output cascode transistor that is coupled to a high side node; and a shared RF processing path for processing of at least two input RF signals of respective second and third frequency bands, the shared RF processing path comprising: an input band selection switch; and a multi-input shared cascode amplifier comprising a plurality of input transistors and a shared output cascode transistor coupled to the plurality of input transistors, wherein: the shared output cascode transistor is coupled to the high side node, and the input band selection switch is configured to selectively couple each of the at least two input RF signals to a shared input transistor of the plurality of input transistors.

According to a second aspect of the present disclosure, a multi-input multi-band low noise amplifier (LNA) is presented, comprising: a dedicated first band RF processing path for processing of a first frequency band RF signal received from an antenna through a dedicated first band filter, the dedicated first band RF processing path comprising: a dedicated first band input matching circuit coupled to a dedicated first band cascode amplifier, the dedicated first band cascode amplifier comprising: a dedicated first band input transistor and a dedicated first band output cascode transistor that is coupled to a high side node; and a shared RF processing path for processing of a second frequency band RF signal received from the antenna through a dedicated second band filter and of a first auxiliary frequency band RF signal that is not received from the antenna, the shared RF processing path comprising: an input band selection switch; a multi-input shared cascode amplifier comprising a plurality of input transistors and a shared output cascode transistor coupled to the plurality of input transistors; and a shared input matching circuit coupled between the input band selection switch and a shared input transistor of the plurality of input transistors, wherein: the shared output cascode transistor is coupled to the high side node, and the input band selection switch is configured to selectively couple one of the second frequency band RF signal or the first auxiliary frequency band RF signal to the shared input transistor.

According to a third aspect of the present disclosure, a method for optimizing performance and cost of a receive side of an RF front end (RFFE) is presented, the method comprising: assigning a performance priority to each band of a plurality of frequency bands for processing by the RFFE, the performance priority including a range from low to high; based on the assigning, establishing an RF processing performance for a respective RF processing path of the each band; based on the establishing, realizing the respective RF processing path based on circuit blocks provided by a toolkit; and based on the realizing, optimizing RF processing performance and cost of the RFFE.

Further aspects of the disclosure are provided in the description, drawings and claims of the present application.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 4A shows a simplified schematic of an input combiner circuit according to an embodiment of the present disclosure.

Like reference numbers and designations in the various drawings indicate like elements.

DETAILED DESCRIPTION

Figure 1A:
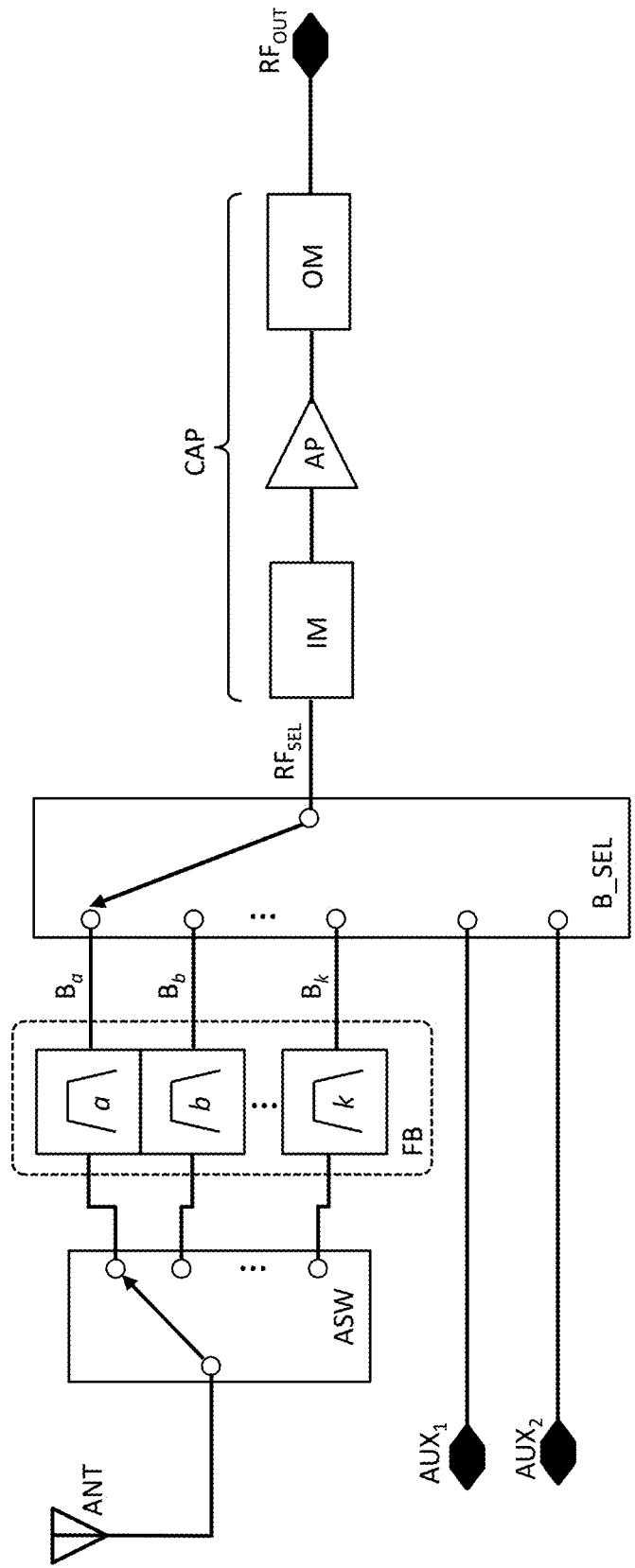
FIG. 1A shows a simplified schematic of a prior RFFE architecture that optimizes cost over performance.
Figure 2A:
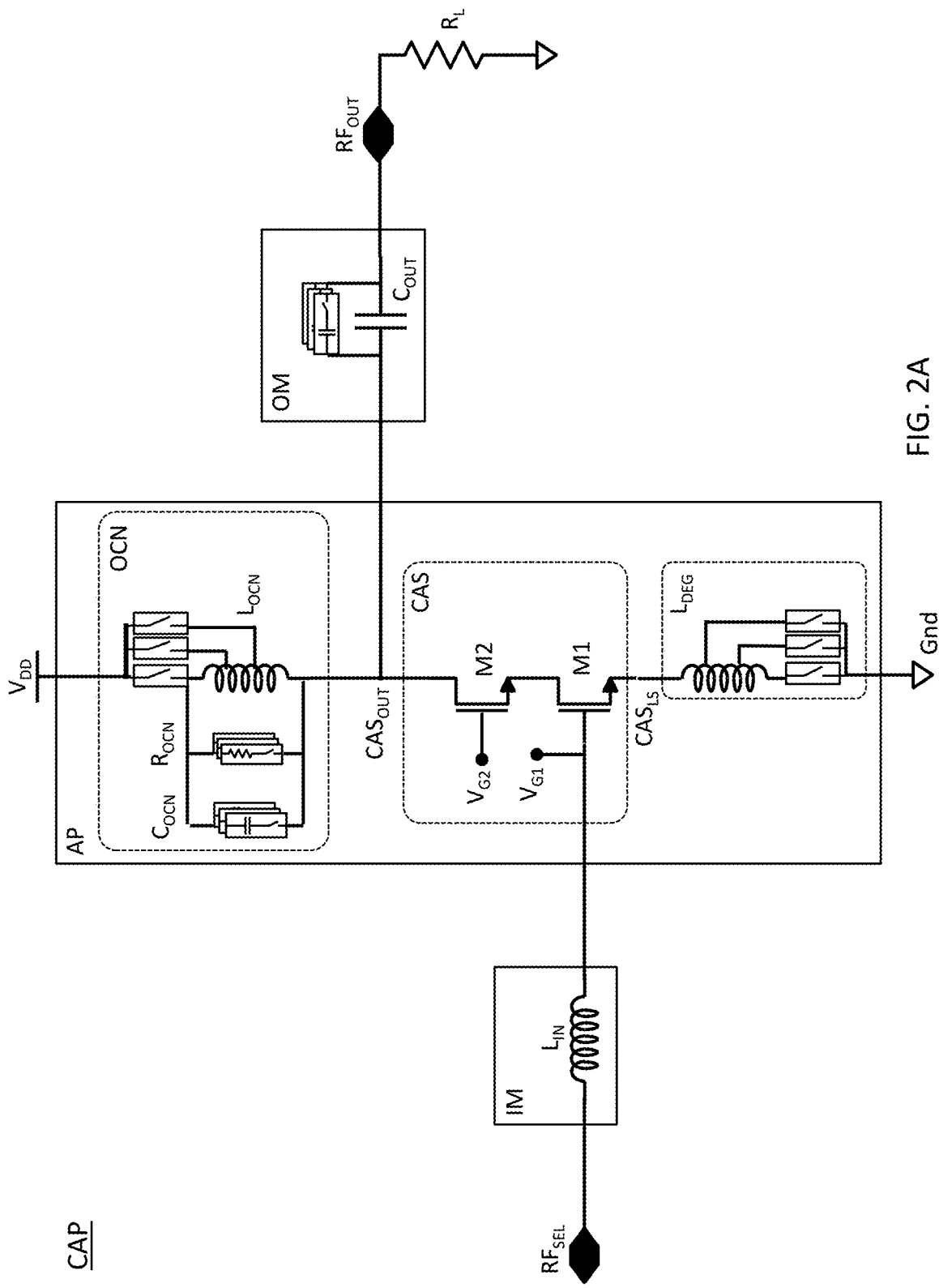
FIG. 2A shows a simplified schematic of an exemplary embodiment of a combined amplification path comprising a single-input cascode amplifier that may be used in the configuration of FIG. 1A.

FIG. 2A shows a simplified schematic of an exemplary embodiment of a combined amplification path, CAP, comprising a single-input cascode amplifier, AP, that may be used in the configuration of FIG. 1A described above. The combined amplification path, CAP, receives a selected input RF signal, $RF_{SEL}$, and outputs an amplified RF signal, $RF_{OUT}$, to a load, $R_L$. The selected input RF signal, $RF_{SEL}$, is coupled to an input transistor, M1, of the single-input cascode amplifier, AP, through an input matching circuit, IM, which as shown in FIG. 2A, may include a series-connected inductor, $L_{IN}$. Input matching to the amplifier, AP, may be provided via a combination of the input matching circuit, $L_{IN}$, and a degeneration inductor, $L_{DEG}$, coupled to a source of the input transistor, M1. For operation across the plurality of supported frequency bands (e.g., $B_a$, $B_b$, ..., $B_k$, $AUX_1$, $AUX_2$ of FIG. 1A), the degeneration inductor, $L_{DEG}$, may be adjustable (e.g., tunable, configurable, programmable, etc.), for example, via inductance selection switches as shown in FIG. 2A.

With continued reference to FIG. 2A, the amplifier, AP, may include one or more cascode transistors (e.g., M2) in series connection with the input transistor, M1. A person skilled in the art is well aware of a principle of operation of the cascode configuration, CAS, comprising a common-source input transistor (e.g., M1) coupled to one or more common-gate (cascode) transistors (e.g., M2). Biasing of the cascode configuration, CAS, may be provided via a supply voltage, $V_{DD}$, and a reference ground, Gnd, coupled between a high side node, $CAS_{OUT}$ (e.g., drain of output cascode transistor M2) and a low side node, $CAS_{LS}$ (e.g., source of the input transistor M1) of the cascode configuration, CAS. As shown in FIG. 2A, the high side node, $CAS_{OUT}$, may be coupled to the supply voltage, $V_{DD}$, through an output network, OCN, and the low side node, $CAS_{LS}$, may be coupled to the reference ground, Gnd, through the degeneration inductor, $L_{DEG}$. Furthermore, gate voltages (e.g., $V_{G1}$, $V_{G2}$, etc.) to gates of the transistors (e.g., M1, M2, etc.) may control a DC current (e.g., amplifier gain) through the cascode configuration, CAS, as well as operating conditions (i.e., biasing points) of each of the transistors (e.g., M1, M2, etc.).

The output network, OCN, of FIG. 2A may include at least one inductor, $L_{OCN}$, in series connection with the cascode configuration, CAS. Similar to the inductor, $L_{DEG}$, in some embodiments, the inductor, $L_{OCN}$, may be adjustable (e.g., via switches shown in FIG. 2A). In some embodiments, the output network, OCN, may include an adjustable capacitor (e.g., $C_{OCN}$) and/or an adjustable resistor (e.g., $R_{OCN}$) in parallel with the inductor, $L_{OCN}$. Elements (e.g., $L_{OCN}$, $C_{OCN}$, $LR_{OCN}$) of the output network, OCN, combined with the output matching circuit, OM, may be used to provide gain and/or output matching that is specific to a frequency band of the plurality of supported frequency bands (e.g., $B_a$, $B_b$, . . . , $B_k$, $AUX_1$, $AUX_2$ of FIG. 1A).

As shown in FIG. 2A, the output matching circuit, OM, coupled to the high side node, $CAS_{OUT}$, may include at least one series-connected capacitor, $C_{OUT}$ (that may also be used as a DC decoupling capacitor). In some embodiments, the capacitor, $C_{OUT}$, may be an adjustable capacitor for providing output matching that is specific to a frequency band of the plurality of supported frequency bands (e.g., $B_a$, $B_b$, . . . , $B_k$, $AUX_1$, $AUX_2$ of FIG. 1A).

As described above with reference to FIG. 1A, the combined amplification path, CAP, of FIG. 2A may not provide (complete) flexibility in optimizing performance with respect to a specific frequency band of the plurality of supported frequency bands (e.g., $B_a$, $B_b$, . . . , $B_k$, $AUX_1$, $AUX_2$ of FIG. 1A). For example, no flexibility may be provided with respect to elements (e.g., $L_{IN}$) of the input matching circuit, IM, or with respect to elements (e.g., M1, M2) of the cascode configuration, CAS. A person skilled in the art would know that, for example, value and/or type (in-circuit vs. out-of-circuit/SMD) of the inductor, $L_{IN}$, and/or characteristics (e.g., size, width) of the transistors (M1, M2) may affect performance of the cascode configuration, CAS, differently for the different supported frequency bands (e.g., $B_a$, $B_b$, . . . , $B_k$, $AUX_1$, $AUX_2$ of FIG. 1A).

Figure 1B:
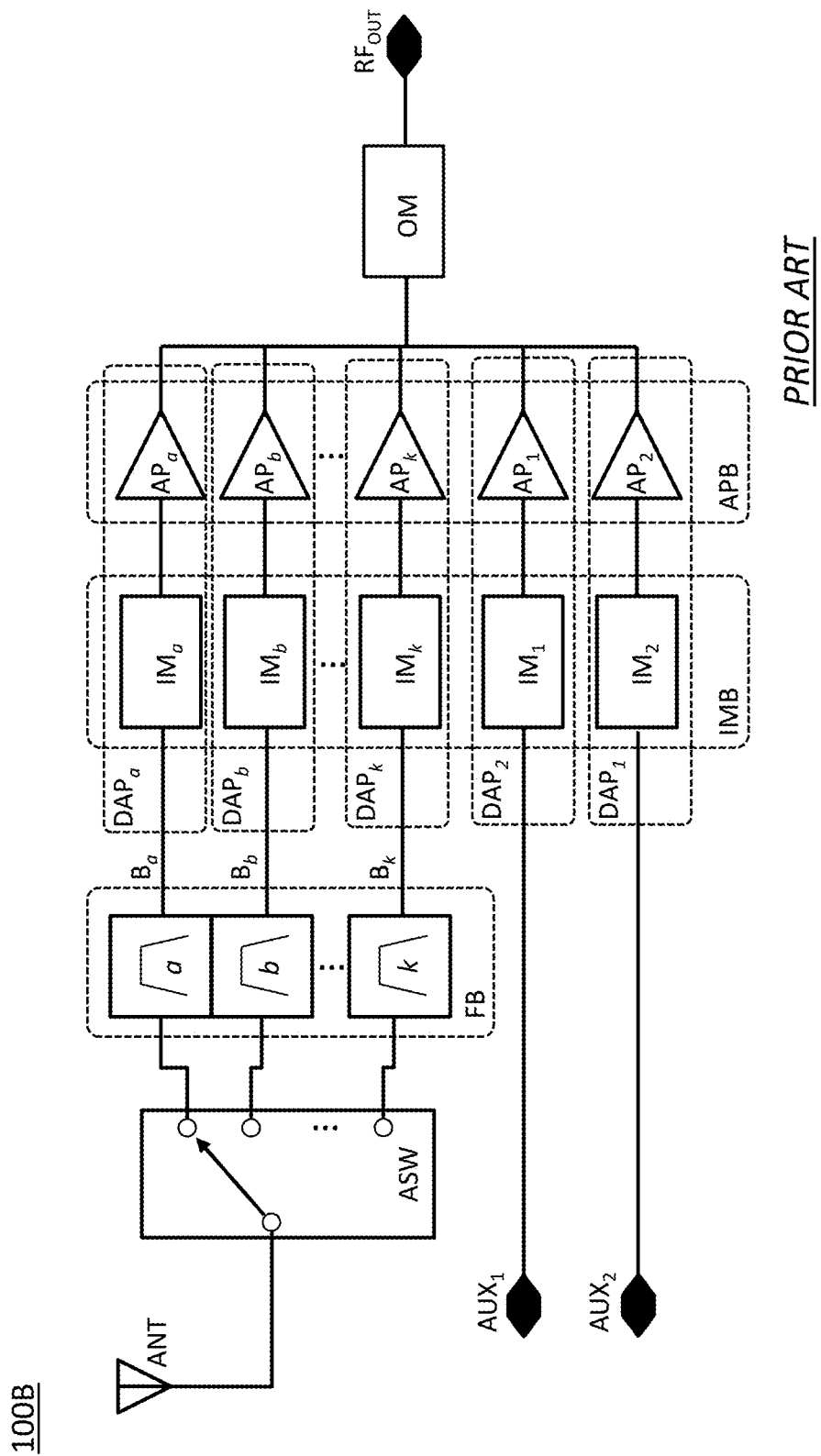
FIG. 1B shows a simplified schematic of a prior RFFE architecture that optimizes performance over cost.
Figure 2B:
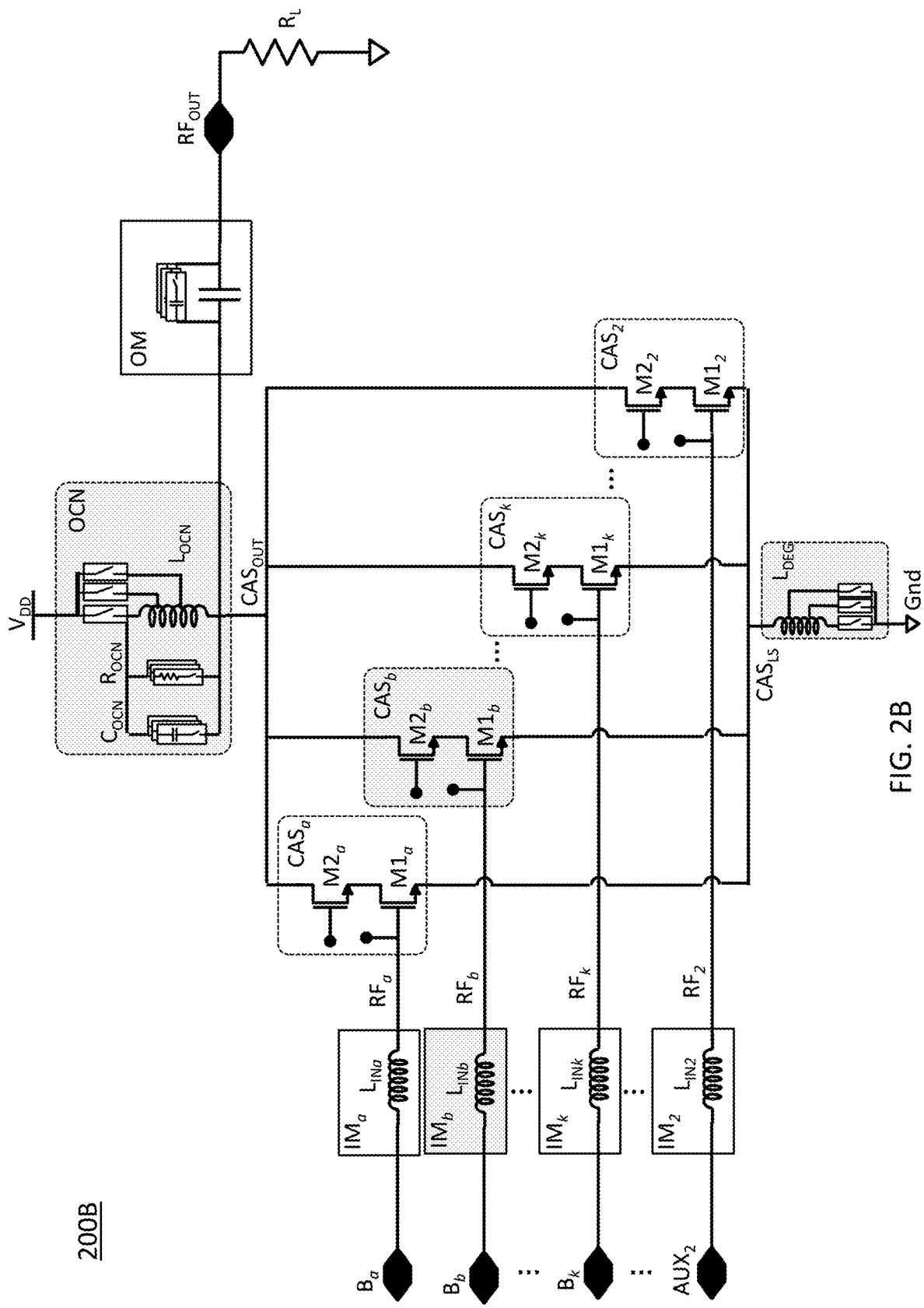
FIG. 2B shows a simplified schematic of an exemplary embodiment of dedicated amplification paths comprising a plurality of dedicated single-input cascode amplifiers that may be used in the configuration of FIG. 1B.

FIG. 2B shows a simplified schematic of an exemplary embodiment of dedicated amplification paths (e.g., $IM_b$, $CAS_b$, OCN, $L_{DEG}$ associated to frequency band $B_b$) comprising a plurality of dedicated single-input cascode amplifiers (e.g., $CAS_b$, OCN, $L_{DEG}$ associated to frequency band $B_b$) that may be used in the configuration of FIG. 1B described above. A person skilled in the art would clearly realize that the configuration (200B) of FIG. 2B is based on the configuration described above with reference to FIG. 2A by providing dedicated input matching circuits (e.g., $IM_a$, $IM_b$, . . . , $IM_k$, $IM_1$, $IM_2$) coupled to respective dedicated cascode configurations (e.g., $CAS_a$, $CAS_b$, . . . , $CAS_k$, $CAS_1$, $CAS_2$) that are coupled (e.g., via nodes $CAS_{OUT}$ and $CAS_{LSL}$) to common elements (e.g., OCN, $L_{DEG}$) to provide respective dedicated amplification paths for each of the supported frequency bands (e.g., $B_a$, $B_b$, . . . , $B_k$, $AUX_1$, $AUX_2$).

With continued reference to FIG. 2B, considering the dedicated amplification path ($IM_b$, $CAS_b$, OCN, $L_{DEG}$) associated to the frequency band, $B_b$, the input matching circuit, $IM_b$, comprising for example a series-connected inductor, $L_{INb}$, receives an input RF signal at the frequency band, $B_b$, and converts it to an RF signal, $RF_b$, that is fed to the input transistor, $M1_b$, of the cascode configuration, $CAS_b$. In turn, the cascode configuration $CAS_b$, comprising transistors ($M1_b$, $M2_b$) coupled between the supply voltage, $V_{DD}$, and the reference ground, Gnd, via high side and low side nodes, $CAS_{OUT}$ and $CAS_{LS}$, amplifies the RF signal, $RF_b$, for output as $RF_{OUT}$ through the output matching circuit, OM, that is coupled to the load, $R_L$. While amplifying/processing the frequency band, $B_b$, other cascode configurations (e.g., $CAS_H$, n≠b) associated to other frequency bands (e.g., $B_n$, n≠b) may be deactivated via, for example, a gate biasing voltage to one or more of the transistors (e.g., $M1_n$ and/or $M2_n$, n≠b).

As shown in FIG. 2B, the dedicated amplification paths include respective dedicated cascode configurations (e.g., $CAS_a$, $CAS_b$, . . . , $CAS_k$, $CAS_1$, $CAS_2$) that are coupled in parallel between the high side node, $CAS_{OUT}$, and the low side node, CASES, and configured to receive dedicated RF signals (e.g., $RF_a$, $RF_b$, . . . , $RF_k$, $RF_1$, $RF_2$) through dedicated input matching circuits (e.g., $IM_a$, $IM_b$, . . . , $IM_k$, $IM_1$, $IM_2$), and output amplified versions thereof through common elements (e.g., OCN, OM) coupled to the high side node, $CAS_{OUT}$. Accordingly, the configuration shown in FIG. 2B overcomes shortcomings of the configuration of FIG. 2A described above by allowing flexibility in choice of elements of the input matching circuits (e.g., $IM_a$, $IM_b$, . . . , $IM_k$, $IM_1$, $IM_2$) and/or of elements/transistors of the cascode configurations (e.g., $CAS_a$, $CAS_b$, . . . , $CAS_k$, $CAS_1$, $CAS_2$), at the expense of added cost (e.g., cost of added elements and larger die area).

As described above, while amplifying/processing the frequency band, $B_b$, other cascode configurations (e.g., $CAS_H$, n≠b) associated to other frequency bands (e.g., $B_n$, n≠b) may be deactivated via, for example, a gate biasing voltage to one or more of the transistors (e.g., $M1_n$ and/or $M2_n$, n≠b). For example, by applying respective gate voltages to the (output) cascode transistors ($M2_n$, n≠b) such transistors can be turned OFF, and therefore the corresponding cascode configurations (e.g., $CAS_n$, n≠b) can be deactivated (e.g., no conduction through the cascode configurations). However, while turned OFF, the cascode transistors ($M2_n$, n≠b) may present a capacitive load to the high side node, $CAS_{OUT}$, which in turn may affect performance (e.g., linearity) of the frequency band, $B_b$, being processed. In other words, the dedicated amplification paths provided by the configuration of FIG. 2B may introduce some undesired effects that can degrade an optimal performance of a specific frequency band.

Teachings according to the present disclosure allow to consider performance priorities of the supported frequency bands and tailor/design/customize respective RF processing paths to achieve desired/specific performances. Performance priority of a frequency band may be in view of, for example, a minimum required sensitivity provided by the corresponding RF processing path which may be achieved by controlling/selecting elements of the RF processing path that may impact sensitivity. Such elements may include elements of the RF processing path that may impact/degrade noise figure (i.e., signal-to-noise figure) such as, for example, insertion loss introduced by switches, or a Q-factor of an inductor used, for example, in an input matching circuit. In other words, by considering a performance priority of a frequency band, a specific performance to be provided by a corresponding RF processing path may not necessarily require a dedicated RF processing path shown in the configuration of FIG. 2B, rather, a combined RF processing path according to the configuration of FIG. 2A may be sufficient. Teaching according to the present disclosure provide the tools (e.g., FIGS. 5A-5C later described) that can be used to customize the respective RF processing paths to achieve the desired/specific performances.

Figure 3A:
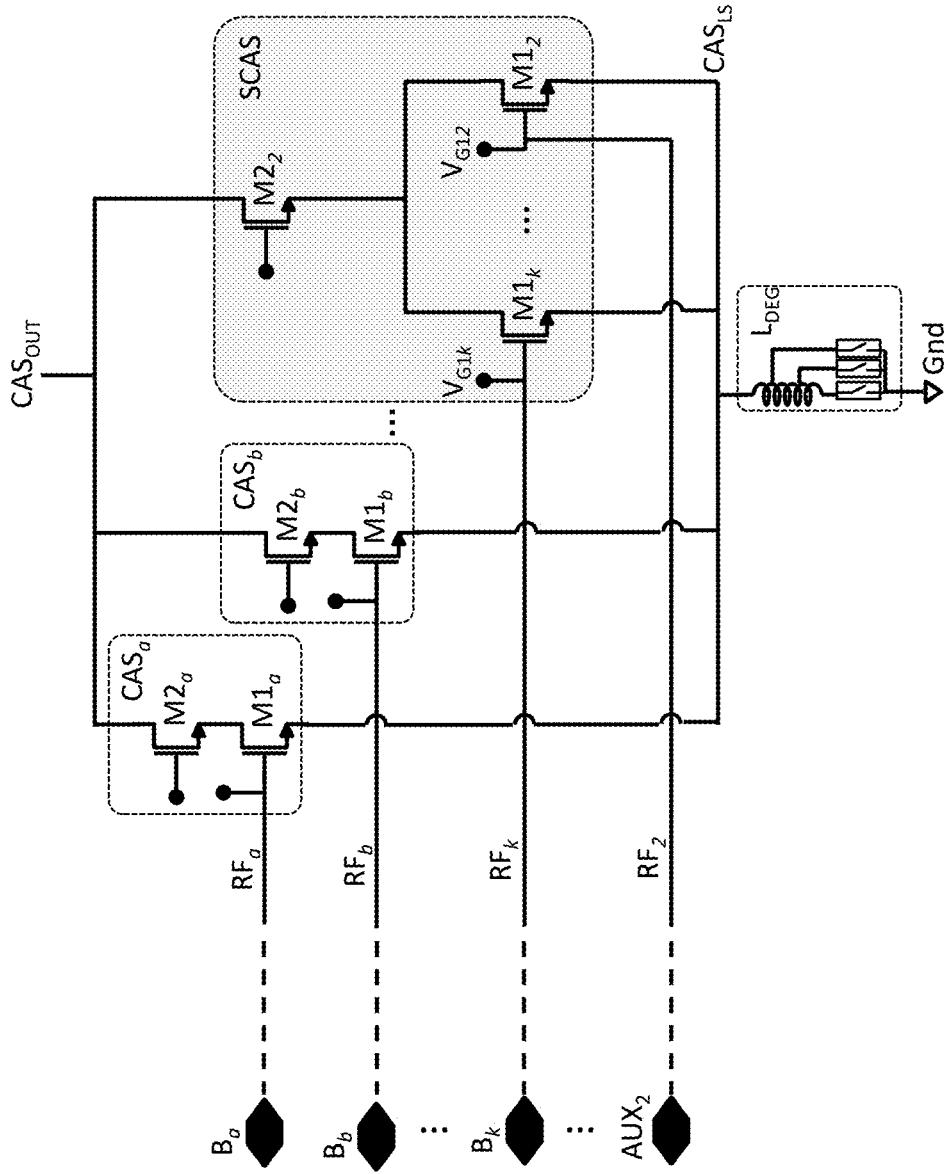
FIG. 3A shows a simplified schematic of an exemplary multi-input cascode amplifier comprising a shared cascode configuration.

Other elements that may impact a performance of an RF processing path may include elements of other RF processing paths. For example, considering the configuration of FIG. 2B, as described above, output cascode transistors ($M2_n$, n≠b) of deactivated cascode configurations (e.g., $CAS_n$, n≠b) coupled to the high side node, $CAS_{OUT}$, can affect/degrade performance of the activated cascode configuration (e.g., $CAS_b$). FIG. 3A shows a multi-input cascode amplifier (300A) comprising a branched/shared cascode configuration (e.g., SCAS) that may be used to reduce a number of output cascode transistors coupled to the high side node, $CAS_{OUT}$, while supporting a same number of frequency bands (e.g., input RF signals).

As shown in FIG. 3A, the shared cascode configuration, SCAS, may be provided by coupling (e.g., connecting) a source of a (shared) cascode transistor (e.g., $M2_2$) to drains of at least two input transistors (e.g., $M1_k, \ldots, M1_2$). In other words, the transistors of the shared cascode configuration, SCAS, form a tree structure that connects a shared cascode transistor (e.g., $M2_2$) to at least two transistors located at a level below a level of the shared cascode transistor. In this context, levels of the transistors being defined by their positions within a stack of transistors (e.g., $M1_k, \ldots, M1_2, M2_2$) that forms the shared cascode configuration, SCAS, with a first level (e.g., input level) corresponding to the input transistors (e.g., $M1_k, \ldots, M1_2$) having respective sources coupled to the low side node, $CAS_{LS}$, and the last level (e.g., output level) corresponding to the output transistor (e.g., $M2_2$) having a drain coupled to the high side node, $CAS_{OUT}$. It should be noted that although the shared cascode configuration, SCAS, of FIG. 3A includes two levels, teachings according to the present disclosure may equally apply to configurations that include more than two levels, such as three levels or more (e.g., input level, intermediate cascode levels, and output level), wherein a corresponding tree structure may be provided by one or more shared cascode transistors located at different levels.

With continued reference to FIG. 3A, by using the shared cascode configuration, SCAS, for processing of, for example, frequency bands (e.g., $B_k, \ldots, AUX_2$) having lower performance priorities, increased performance may be provided to the dedicated RF processing paths (e.g., using dedicated cascode configurations $CAS_a$, $CAS_b, \ldots$, etc.) having, for example, higher performance priorities. In other words, the shared cascode configuration, SCAS, and the dedicated cascode configuration (e.g., $CAS_a$, $CAS_b, \ldots$, etc.) shown in FIG. 3A may be considered as elements that are part of a toolkit according to the present disclosure that can be used to customize the RF processing paths of the supported frequency bands (e.g., $B_a, B_b, \ldots, B_k, \ldots, AUX_2$) to achieve the desired/specific performances.

Figure 3B:
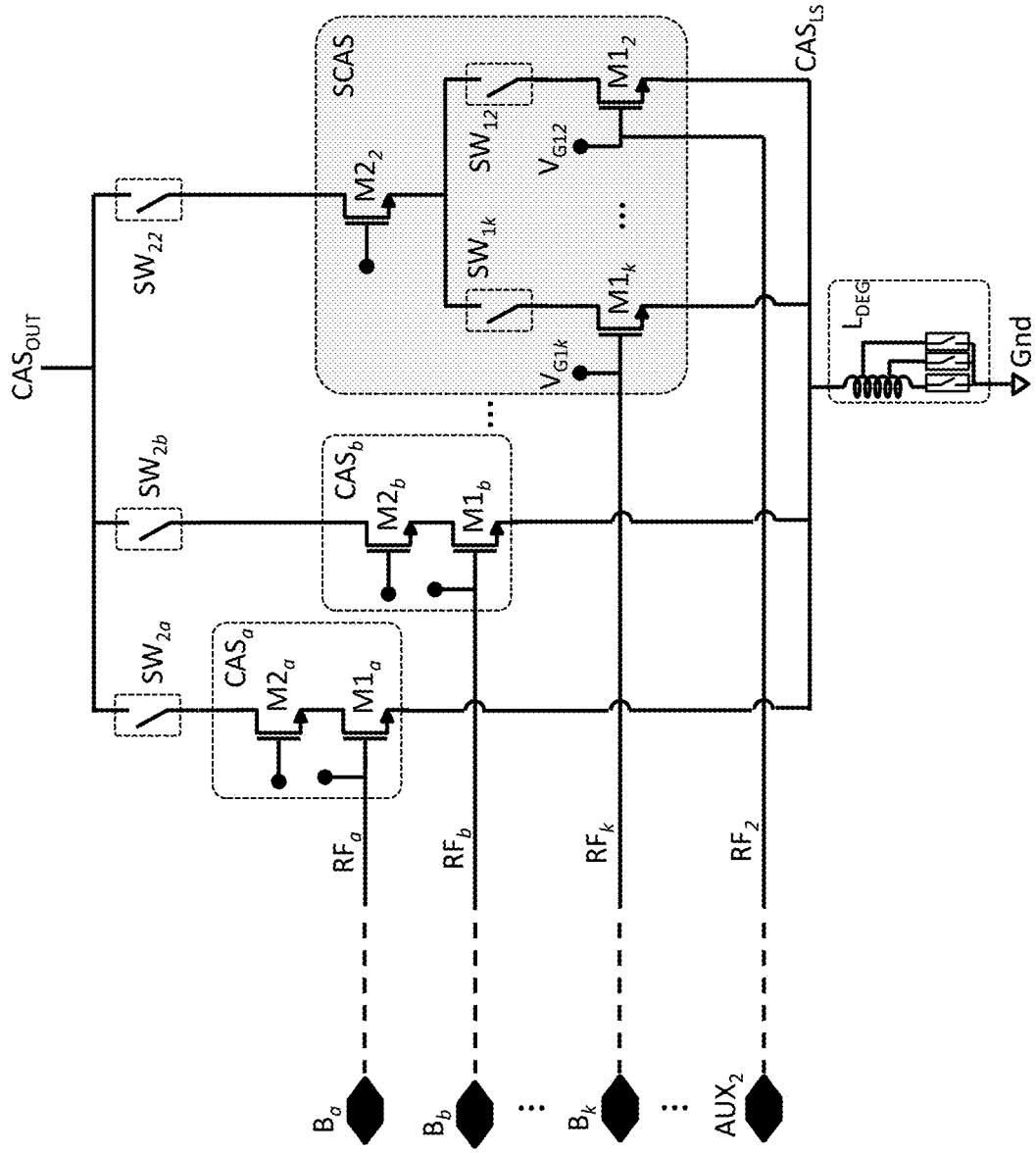
FIG. 3B shows a simplified schematic of an exemplary multi-input cascode amplifier comprising a shared cascode configuration with branch decoupling switches.

FIG. 3B shows a simplified schematic of a multi-input cascode amplifier (300B) comprising a shared cascode configuration, SCAS, as described above with reference to FIG. 3A. The configuration of FIG. 3B further includes series switches (e.g., $SW_{2a}, SW_{2b}, SW_{22}$) that may be coupled between (output nodes of) each of the cascode configurations ($CAS_a$, $CAS_b$, SCAS) and the high side node, $CAS_{OUT}$, and/or series switches (e.g., $SW_{1k}, \ldots, SW_{12}$) that may be coupled between the shared cascode transistor (e.g., $M2_2$) and the lower level (input) transistors (e.g., $M1_k, \ldots, M1_2$). Such switches may be used for selective activating/deactivating of corresponding RF processing paths instead (or in addition) of use of gate voltages as described above. Use of such switches may be advantageous since, in contrast to transistors (e.g., $M1_k, \ldots, M1_2, M1_2$) used as active elements of an amplifier, characteristics of the transistors used to form such switches may be optimized for operation as a switch with no regards to operation as an amplifier. As known to a person skilled in the art, such switches may be designed to provide a low ON resistance to reduce attenuation of a conducted RF signal when the RF processing path containing a switch is activated, and a low OFF capacitance to reduce capacitive loading on other processing paths when the RF processing path containing the switch is deactivated. It should be noted that although FIG. 3B shows each of the available RF processing paths including at least one switch, according to some embodiments of the present disclosure one or more of the RF processing paths may not include any switch. This is shown in the exemplary configuration (300C) of FIG. 3C, wherein the RF processing path for the frequency band, $B_a$, does not include a switch coupled between a respective cascode configuration, $CAS_a$, and the high side node, $CAS_{OUT}$. Or in other words, the cascode configuration, $CAS_a$, (i.e., output cascode transistor $M2_a$) is unconditionally coupled to the high side node, $CAS_{OUT}$, whereas, for example, the cascode configuration, $CAS_b$, (i.e., output cascode transistor $M2_b$) and the shared cascode configuration, SCAS, (i.e., output cascode transistor $M2_2$) are selectively coupled to the high side node, $CAS_{OUT}$, via respective switches $SW_{2b}$ and $SW_{22}$. The configuration (300C) of FIG. 3C may allow increased performance for processing of the frequency band, $B_a$, when compared to the performance provided for processing of the frequency band, $B_b$.

FIG. 4A shows a simplified schematic of an input combiner circuit, ICN, according to an embodiment of the present disclosure that may be used to combine processing paths of at least two frequency bands to a common/shared processing path. For example, as shown in FIG. 4A, a band selection switch, B_SEL, may combine processing paths for the frequency bands $B_k$ and $AUX_1$ to a common processing path that includes one input match circuit (e.g., $IM_k$). In the configuration (400A) shown in FIG. 4A, a performance priority of the bands $B_k$ and $AUX_1$ may be lower than respective performance priorities of the bands $B_a$, $B_b$, and $AUX_2$. Such lower performance priority may allow the bands $B_k$ and $AUX_1$ to be subjected, for example, to a higher insertion loss provided by the switch, B_SEL, and by a Q-factor of the input match circuit, $IM_k$ (which cannot be optimized across both frequency bands). On the other hand, the lack of a switch and provision of dedicated input matching circuits (e.g., $IM_a$, $IM_b$, $IM_2$), may allow higher performance RF processing paths for the respective frequency bands (e.g., $B_a$, $B_b$, $AUX_2$) having higher performance priorities.

Figure 3C:
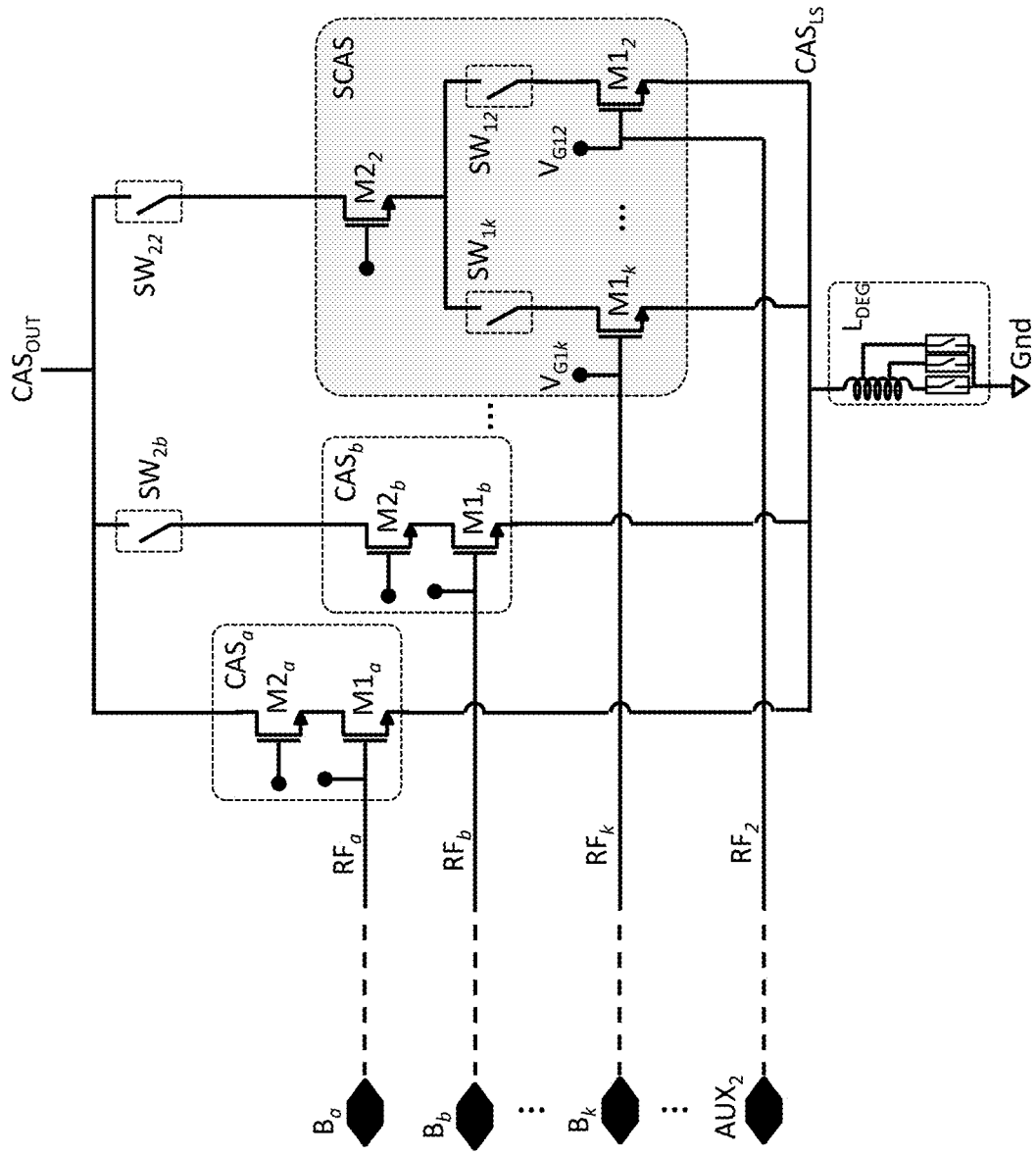
FIG. 3C shows a simplified schematic of another exemplary multi-input cascode amplifier comprising a shared cascode configuration with branch decoupling switches.

The configuration (400) of FIG. 4A shows processing of the supported frequency bands (e.g., $B_a, B_b, \ldots, B_k, AUX_1, AUX_2$) for provision of the RF signals ($RF_a, RF_b, \ldots, RF_k, RF_2$) that may be input to the cascode configurations (e.g., $CAS_a, CAS_b, \ldots,$ SCAS) of any one of the configurations shown in FIG. 3A, FIG. 3B or FIG. 3C. In particular, RF signals (e.g., $RF_a, RF_b$) of the higher performance priority frequency bands (e.g., $B_a, B_b$) may be processed through dedicated cascode configurations (e.g., $CAS_a, CAS_b$), the (combined) RF signal (e.g., $RF_k$) of the lower performance priority frequency bands (e.g., $B_k, AUX_1$) may be processed through one branch (e.g., $M1_k$, $M2_2$) of the shared cascode configuration, SCAS, and the RF signal (e.g., $RF_2$) of the higher performance priority frequency band (e.g., $AUX_2$) may be processed through another branch (e.g., $M1_2$, $M2_2$) of the shared cascode configuration, SCAS.

With continued reference to FIG. 4A in view of FIGS. 3A-3C, routing of the higher performance priority frequency bands (e.g., $B_a$, $B_b$) through the respective dedicated cascode configurations (e.g., $CAS_a$, $CAS_b$) and of the higher performance priority frequency band (e.g., $AUX_2$) through the shared cascode configuration, SCAS, further differentiates the higher performance priorities based on a highest performance priority wherein no sharing of a cascode configuration is provided, and a relatively lower performance priority wherein sharing of the cascode configuration is provided. In other words, teachings according to present disclosure is based on a multitier approach that assigns different tiers to different (groups of) frequency bands, each tier being assigned to a different set/combination of elements/circuits from a toolkit to tailor/design/customize an RF processing path with a desired/specific performance. A first tier (e.g., tier one, highest performance priority) may be assigned to the frequency bands (e.g., $B_a$, $B_b$) which may not share the input matching circuit and the cascode configuration; a second tier (e.g., tier two, medium or lower performance priority) may be assigned to the frequency bands (e.g., $AUX_2$) which may not share the input matching circuit but may share the cascode configuration; and a third tier (e.g., tier three, lowest performance priority) may be assigned to the frequency bands (e.g., $B_k$, $AUX_1$) which may share the input matching circuit and the cascode configuration.

Figure 4B:
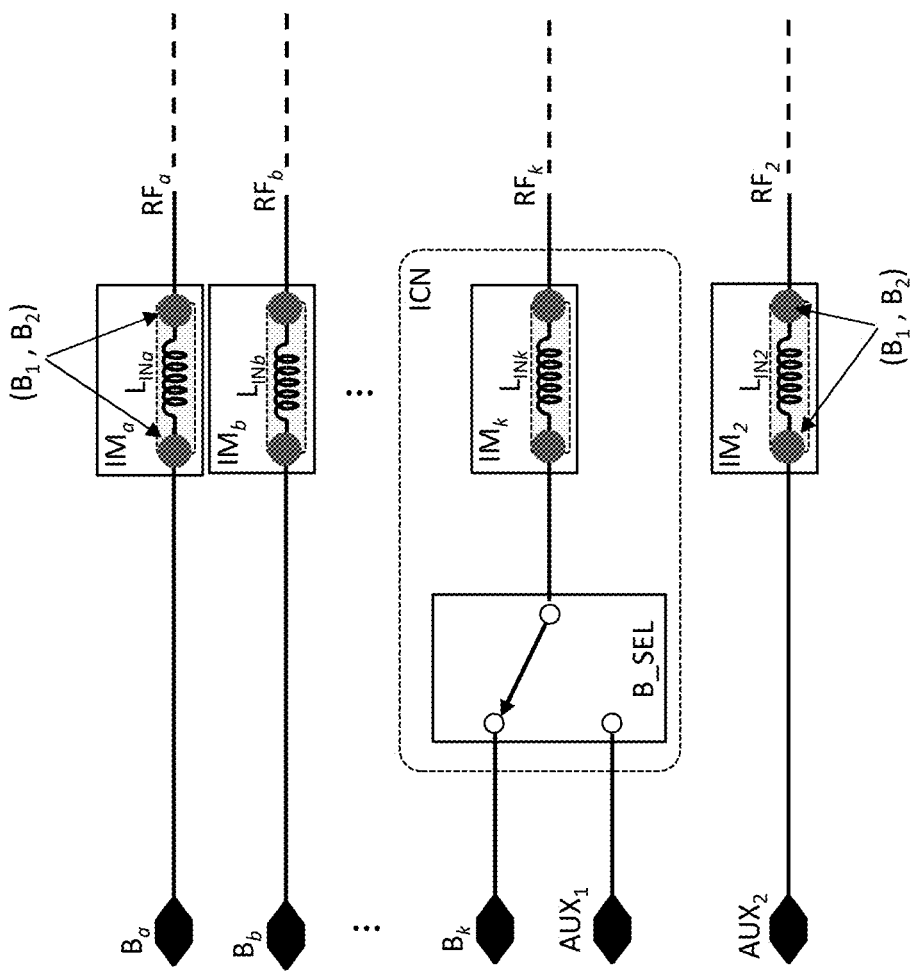
FIG. 4B shows an exemplary embodiment of inductors used in input matching circuits.

FIG. 4B shows an exemplary embodiment of inductors (e.g., $L_{INa}$, $L_{INb}$, $L_{INk}$, $L_{IN2}$) used in respective input matching circuits (e.g., $IM_a$, $IM_b$, $IM_k$, $IM_2$). A person skilled in the art would know that in some (traditional) RF frequency range of operation, optimal value of respective Q-factors of the inductors (e.g., $L_{INa}$, $L_{INB}$, $L_{INk}$, $L_{IN2}$), and therefore optimal noise figure performance provided by such inductors when used in matching circuits, may be provided via fixed value SMD (surface mount device) inductors. In other words, via out-of-circuit inductors that may be coupled/fixated/soldered to the respective RF processing paths via bumps (e.g., B1 and B2 shown in FIG. 4B) formed on the RFFE module. As known to a person skilled in the art, provision of such bumps (e.g., B1, B2) may require considerable die area which can therefore affect size and cost of the RFFE module.

Figure 5A:
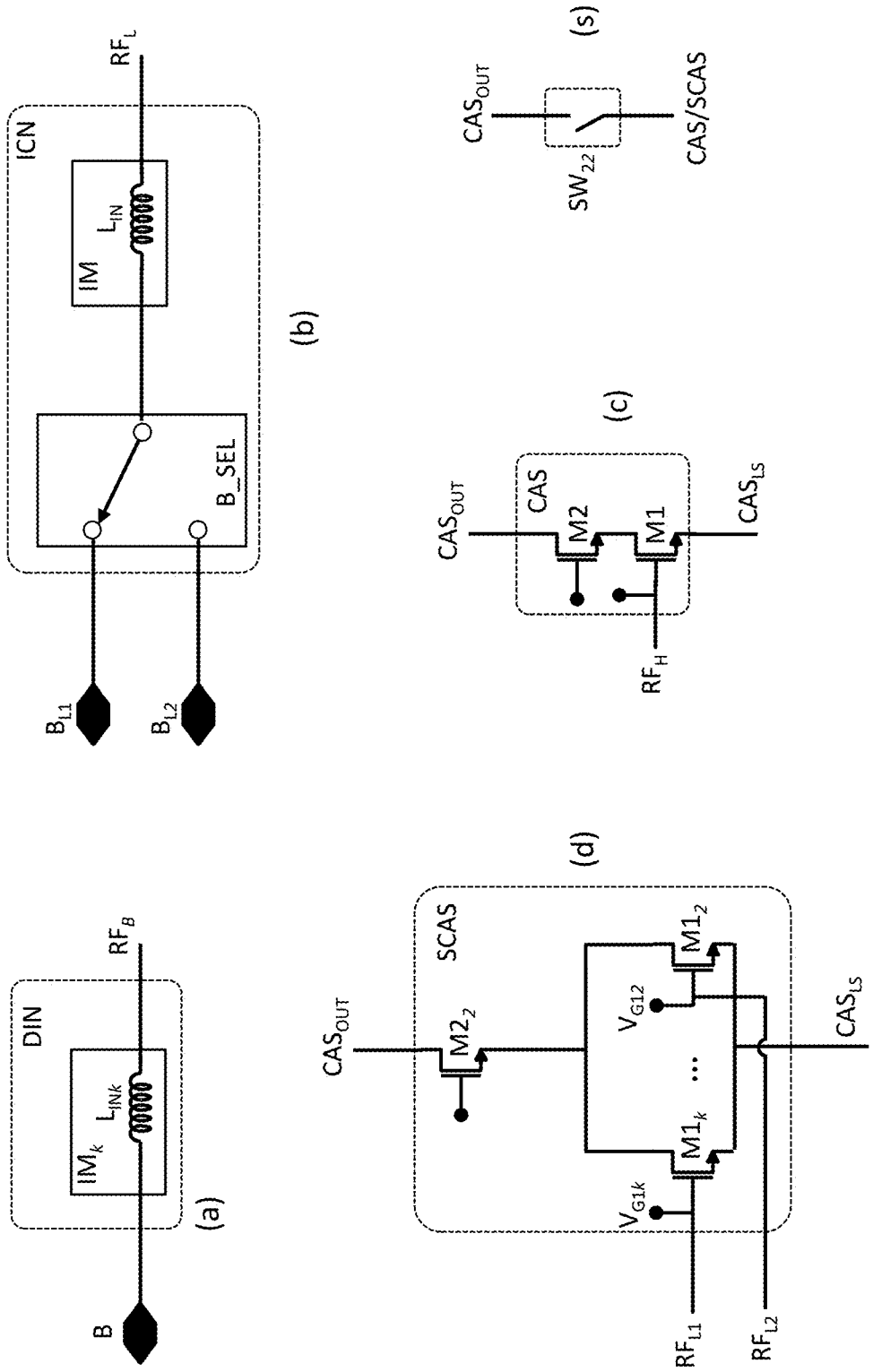
FIG. 5A shows various circuit blocks according to the present disclosure that may be used for optimizing performance or cost of an RF processing path of a hybrid input RFFE architecture according to the present disclosure.

The multitier approach according to the present disclosure may allow to reduce cost/size of tier three frequency bands by reducing a number of inductors of the input matching circuits of the corresponding RF processing paths via the input combiner circuit, ICN, shown in FIG. 4B. On the other hand, the multitier approach according to the present disclosure may allow to increase performance of tiers one and two frequency bands via dedicated inductors (e.g., $L_{INa}$, $L_{INb}$, $L_{IN2}$) of dedicated input matching circuits (e.g., $IM_a$, $IM_b$, $IM_2$) shown in FIG. 4B. It should be noted that teachings according to the present disclosure are not limited to SMD inductors, and therefore for (higher) frequency ranges of operation where performance of such SMD inductors degrade, in-circuit inductors (e.g., per FIG. 4A) that do not require bumps may be used. As known by a person skilled in the art, such in-circuit inductors may be formed via appropriate routing geometries of traces/conductors in a circuit FIG. 5A shows various circuit blocks (e.g., a, b, c, d, s) according to the present disclosure that may be used for optimizing performance or cost of an RF processing path of a hybrid input RFFE architecture according to the present disclosure. Such circuit blocks (e.g., circuits with specific functionalities) are based on the above description with reference to FIGS. 3-4, and include: a dedicated input matching circuit, DIN, represented by the circuit block (a); an input combiner circuit, ICN, represented by the circuit block (b); a dedicated cascode amplifier/configuration represented by the circuit block (c); and a shared cascode amplifier/configuration represented by the circuit block (d). The circuit blocks (a, b, c, d, s) may be considered part of the toolkit according to the present teachings that may be used to tailor/design/customize an RF processing path with a desired/specific performance according to the multitier approach described above. In particular, each RF processing path may include a combination of one of (a) or (b), with one of (c) or (d). Furthermore, each RF processing path may be further combined with the circuit block (s). In turn, such combination may be coupled to the common circuit blocks (e, f, g) (or instead to e', g) shown in FIG. 5B to complete the RF processing path.

Figure 5B:
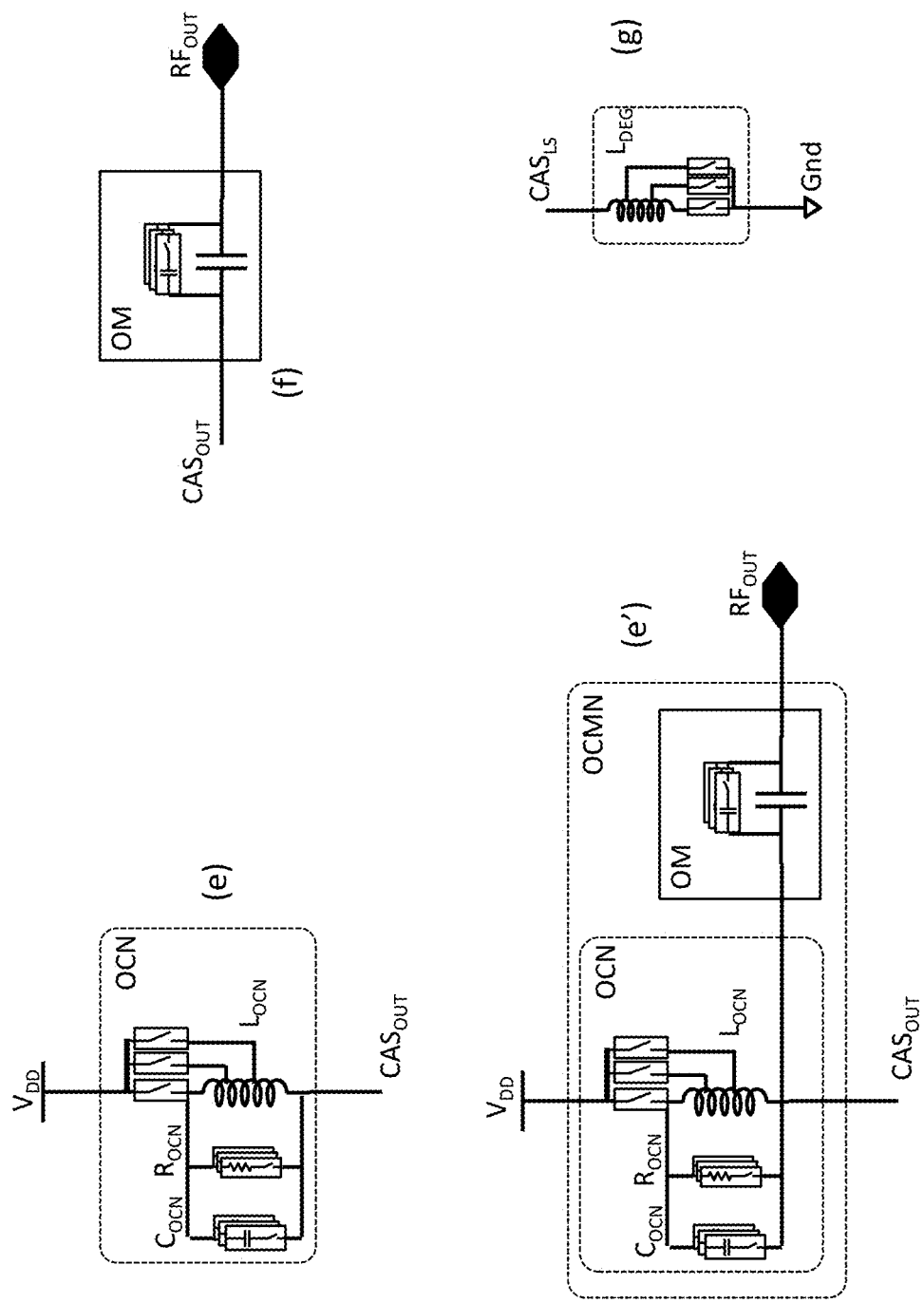
FIG. 5B shows various circuit blocks that may be common to the RF processing paths of hybrid input RFFE architecture according to the present disclosure.

FIG. 5B shows various circuit blocks (e.g., e, f, g, e') that may be common to the RF processing paths of hybrid input RFFE architecture according to the present disclosure. Such circuit blocks are based on the above description with reference to FIGS. 3-4, and include: an output combining network, OCN, represented by the circuit block (e); an output matching circuit, OM, represented by the circuit block (f); and a degeneration inductor, $L_{DEG}$, represented by the circuit block (g). As shown in FIG. 5B, the blocks (e) and (f) may be combined to form an output combining and matching network, OCMN, that is represented by the circuit block (e').

Figure 5C:
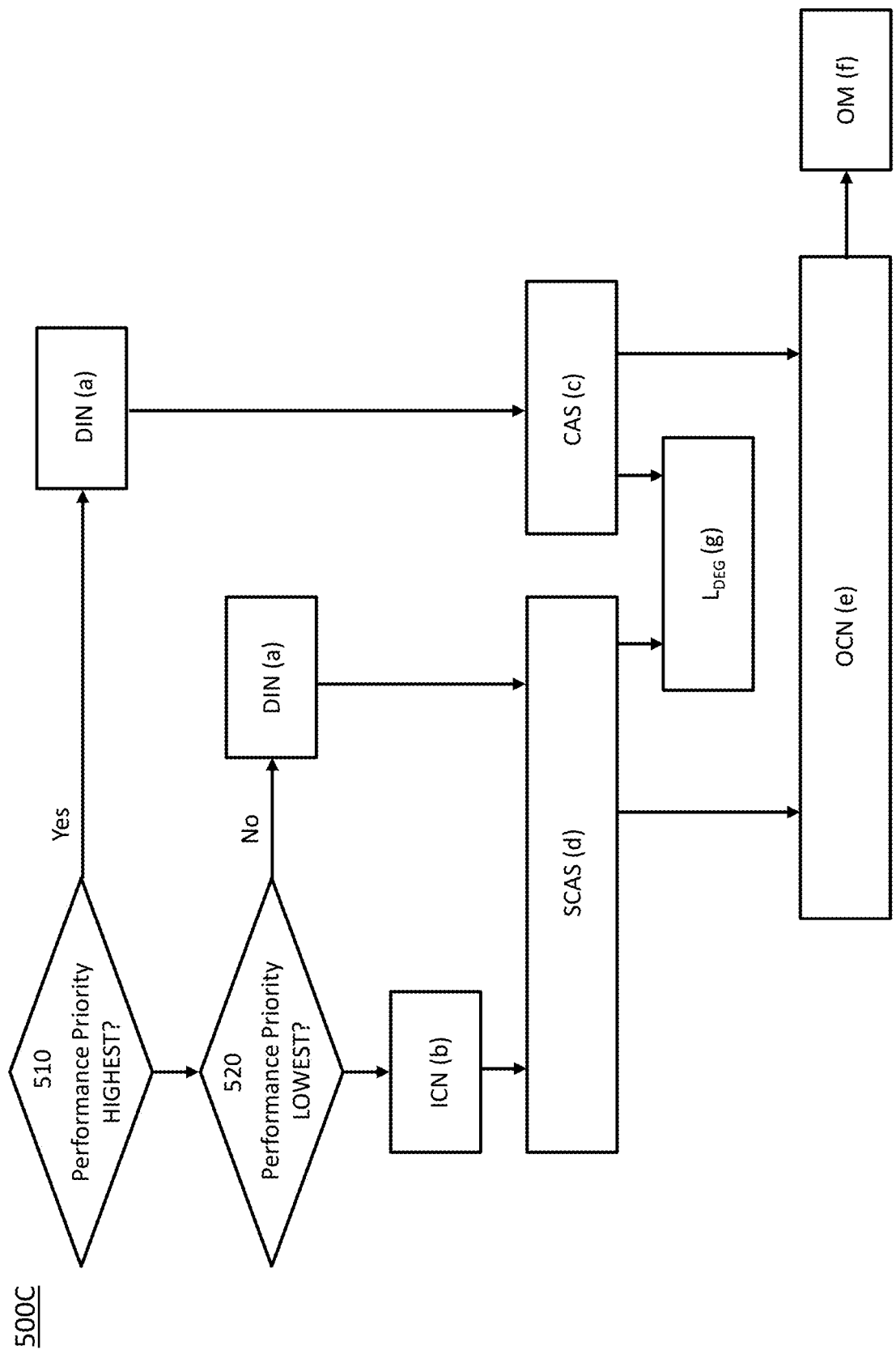
FIG. 5C shows a decision tree that may be used to realize the hybrid input RFFE architecture according to the present disclosure.

The RF processing paths of the hybrid input RFFE architecture according to the present disclosure may be realized by combining one of the circuit block pairs (a, c), (a, d) or (b, d) of FIG. 5A with the common circuit blocks (e, f, g) of FIG. 5B, wherein a selection of the circuit block pairs for realizing a given RF processing path may be based on the multitier approach according to the present disclosure described above, and summarized in the decision tree (500C) shown in FIG. 5C. As shown in FIG. 5C, realization of each of the RF processing paths may be based on at least two decisions represented by decision blocks (510) and (520). Decision block (510) establishes whether or not the RF processing path is of (e.g., associated to) a highest performance priority (e.g., tier one), and decision block (520) establishes whether or not the RF processing path is of (e.g., associated to) the lowest performance priority (e.g., tier three). It should be noted that such decisions may be equivalent to requirement or not for a dedicated cascode configuration (e.g., decision block 510), and requirement or not for a dedicated input matching circuit (e.g., decision block 520).

With continued reference to FIG. 5C, according to one exemplary embodiment of the present disclosure, if the top decision block (510) establishes that the RF processing path is of the highest performance priority (e.g., tier one), then the RF processing path may be assigned (e.g., realized via) circuit blocks (a, c) coupled to the common circuit blocks (e, f, g). If the combination of the decision blocks (510) and (520) establish that the RF processing path is of the medium performance priority (e.g., not of the lowest or highest performance priority, tier two), then the RF processing path may be assigned (e.g., realized via) circuit blocks (a, d)

coupled to the common circuit blocks (e, f, g). On the other hand, if the combination of the decision blocks (510) and (520) establish that the RF processing path is of the lowest performance priority (e.g., tier three), then the RF processing path may be assigned (e.g., realized via) circuit blocks (b, d) coupled to the common circuit blocks (e, f, g).

Figure 5D:
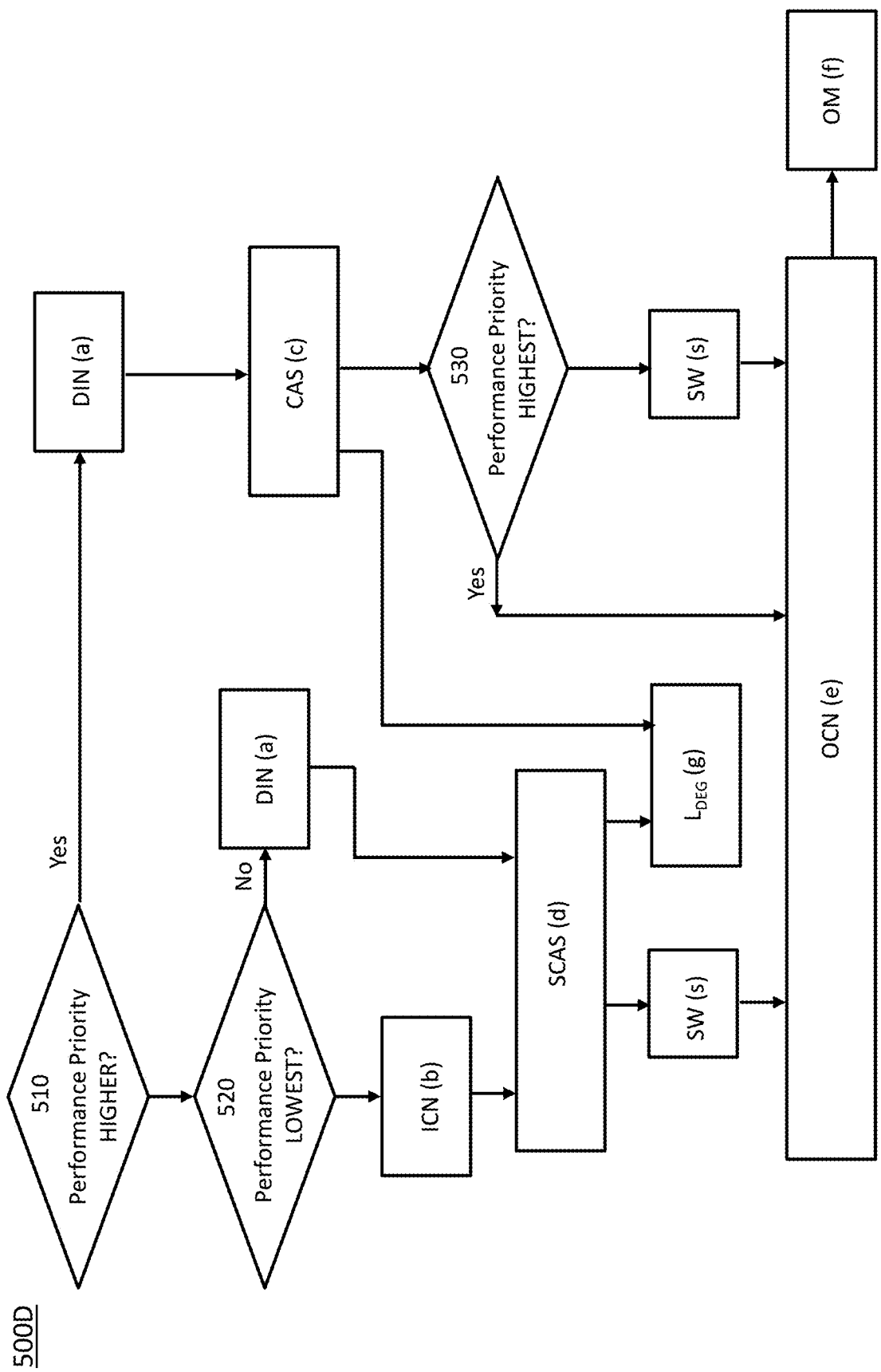
FIG. 5D shows another decision tree that may be used to realize the hybrid input RFFE architecture according to the present disclosure.

In an alternative embodiment according to the present disclosure and as shown in the decision tree (500D) of FIG. 5D, if the top decision block (510) establishes that the RF processing path is of a higher performance priority (e.g., tier one as described above, or a tier 1.5 that is higher than the tier 2 but lower than the tier 1), then the RF processing path may be assigned (e.g., realized via) circuit blocks (a, c) coupled to the common circuit blocks (e, f, g). Furthermore, distinction between the tier 1 (highest priority) or tier 1.5 (higher priority without being the highest priority) may be made via the decision block (530). Based on the outcome of the decision block (530), for the highest priority RF processing path, the circuit blocks (a, c) may be coupled to the common circuit block (e) directly and therefore without use of a series switch provided by the circuit block (s). On the other hand, for the higher (but not highest) priority RF processing path, the circuit blocks (a, c) may be coupled to the common circuit block (e) through the series switch provided by the circuit block (s). As described above (e.g., with reference to FIG. 3C), coupling of RF processing paths other than a highest priority RF processing path to the common circuit block (e) through the series switch provided by the circuit block (s) can allow reducing off (path) capacitances presented to the highest priority RF processing path at the high side node $CAS_{OUT}$. Accordingly, as shown in the decision tree (500D) of FIG. 5D, all of the RF processing paths that are not of the highest priority are coupled to the common circuit block (e) through a series switch provided by the circuit block (s).

Figure 6A:
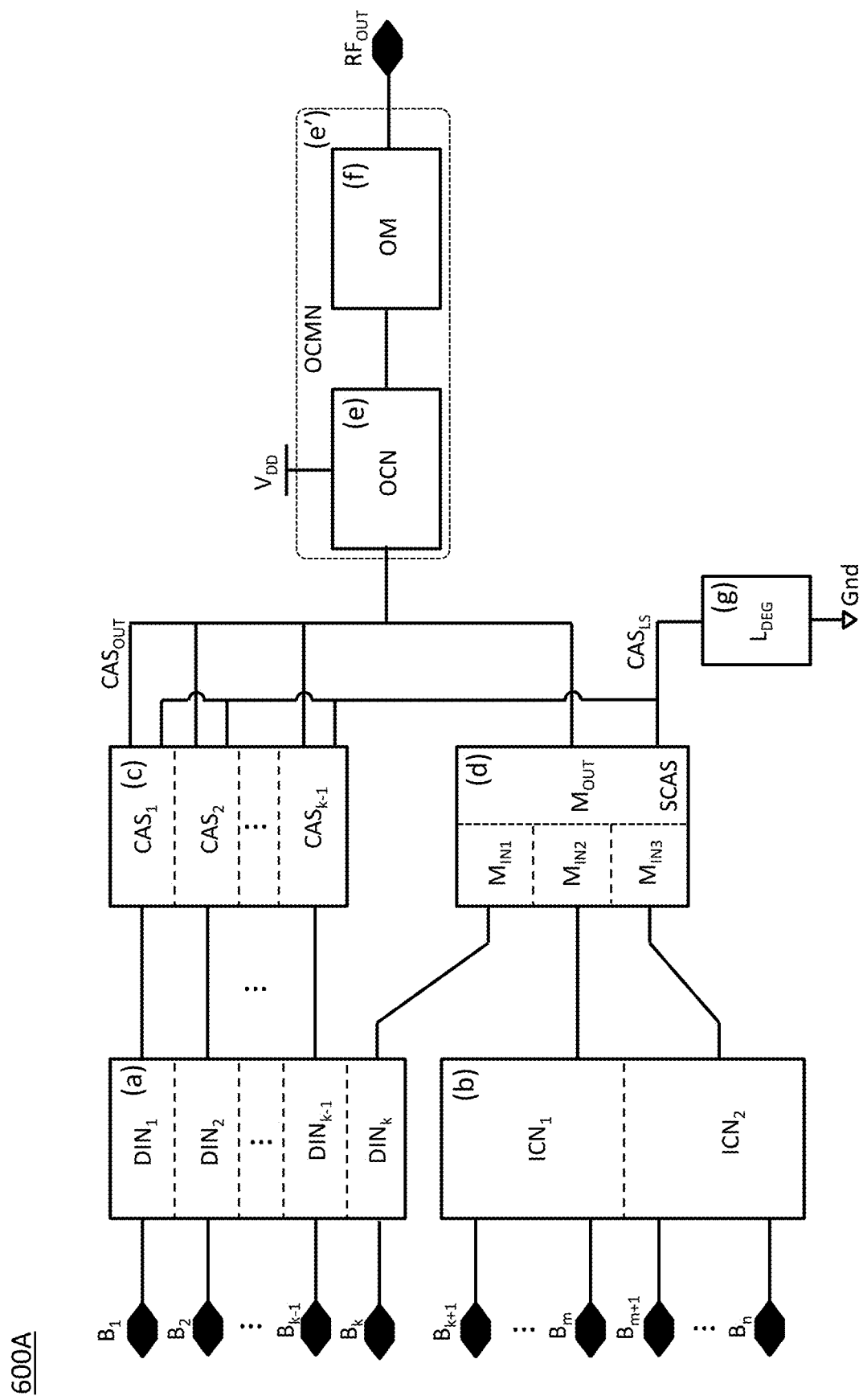
FIG. 6A shows a block diagram of a hybrid input RFFE architecture according to the present disclosure realized via the decision tree of FIG. 5C.

FIG. 6A shows a block diagram of a hybrid input RFFE architecture (600A) according to the present disclosure realized via the decision tree of FIG. 5C. Accordingly, RF processing paths corresponding to the highest performance priority (e.g., tier one) frequency bands $(B_1, \ldots, B_{k-1})$ are realized via respective dedicated circuit blocks (a) (e.g., $DIN_1, \ldots, DIN_{k-1}$), coupled to respective dedicated circuit blocks (c) (e.g., $CAS_1, \ldots, CAS_{k-1}$), coupled to common circuit blocks (e, f, g) (e.g., OCN, OM, $L_{DEG}$), or to common circuit blocks (e', g) (e.g., OCMN, $L_{DEG}$). The RF processing path corresponding to the medium performance priority (e.g., tier two) frequency band, $B_k$, is realized via a dedicated circuit block (a) (e.g., $DIN_k$), coupled to an input transistor (e.g., $M_{IN1}$) of a shared circuit block (d) (e.g., SCAS), and coupled via a shared output cascode transistor (e.g., $M_{OUT}$) of the shared circuit block (d) to the common circuit blocks (e', g). Finally, the RF processing paths corresponding to the lowest performance priority (e.g., tier three) frequency bands, $(B_{k+1}, \ldots, B_n)$ are realized via two shared circuit blocks (b) (e.g., $ICN_1, ICN_2$), coupled to respective input transistors (e.g., $M_{IN2}, M_{IN3}$) of the shared circuit block (d) (e.g., SCAS), and coupled via the shared output cascode transistor (e.g., $M_{OUT}$) of the shared circuit block (d) to the common circuit blocks (e', g). It should be noted that the block diagram of FIG. 6A shows an exemplary architecture which may be expanded to support any number of frequency bands, including zero, within any of the tiers.

Figure 6B:
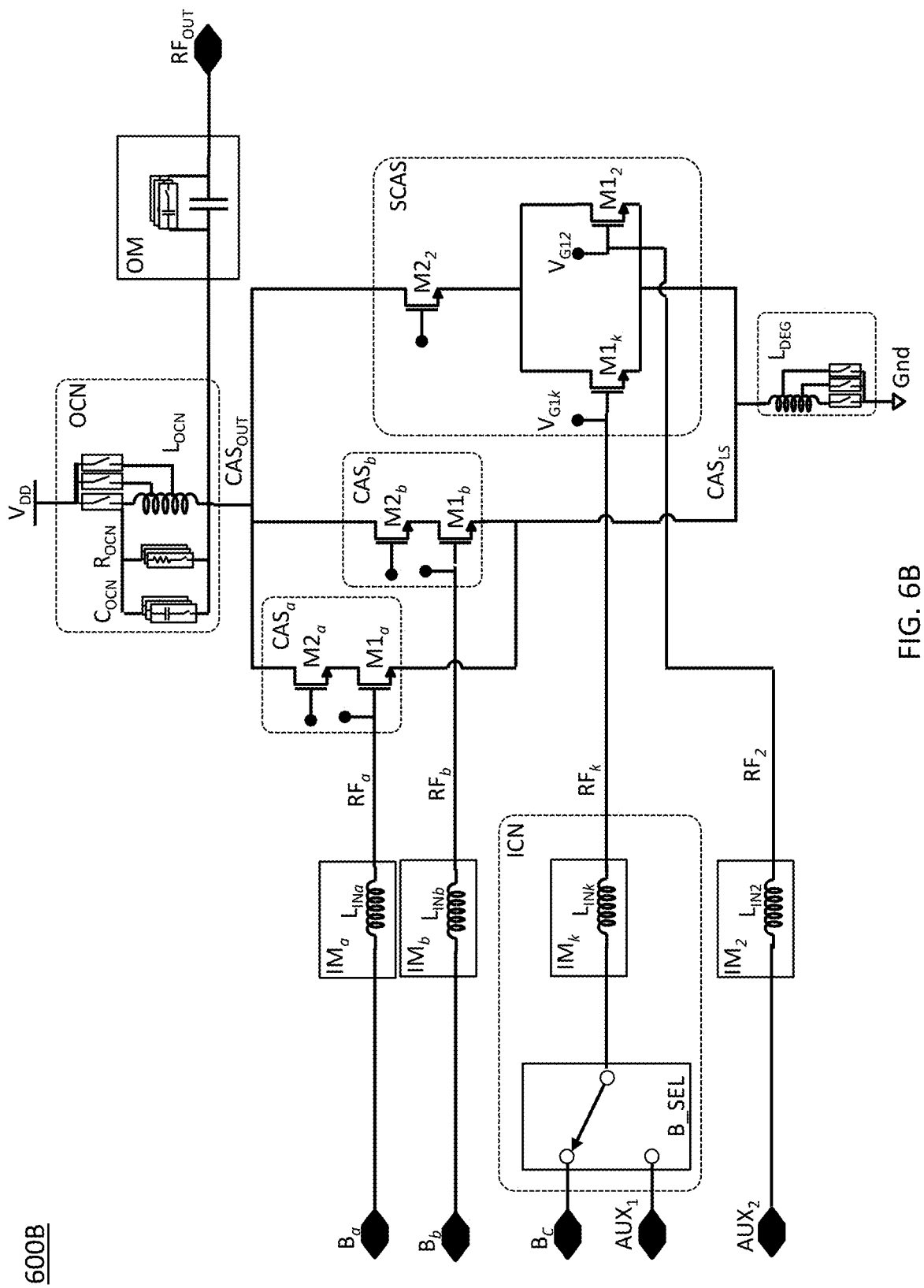
FIG. 6B shows a simplified schematic of a hybrid input RFFE architecture according to the present disclosure.

FIG. 6B shows a simplified schematic of a hybrid input RFFE architecture (600B) according to the present disclosure. In particular, the architecture (600B) is based on application of the decision tree of FIG. 5C on the frequency bands (e.g., $B_a, B_b, \ldots, B_k, AUX_1, AUX_2$) supported by the prior art RFFE architectures shown in FIGS. 1A and 1B. Accordingly, the tier one frequency bands $(B_a, B_b)$ are processed via respective dedicated RF processing paths provided by dedicated input matching circuits $(IM_a, IM_b)$ (respectively comprising inductors $L_{INa}$ and $L_{INb}$) that are respectively coupled to dedicated cascode amplifier configurations $(CAS_a, CAS_b)$; the tier two frequency band, $AUX_2$, is processed via a dedicated input matching circuit (e.g., $IM_2$ comprising inductor $L_{IN2}$) coupled to a dedicated input (e.g., input transistor $M1_2$) of a shared cascode configuration, SCAS; and the tier three frequency bands $(B_e, AUX_1)$ are processed via a selection switch, B_SEL, coupled to a shared input matching circuit (e.g., $IM_k$ comprising inductor $L_{INk}$) of an input combiner network, ICN, coupled to a dedicated input (e.g., input transistor $M1_k$) of the shared cascode configuration, SCAS. Furthermore, each of the RF processing paths is coupled to the output combiner network, OCN, and to the output matching circuit, OM, via the high side node, $CAS_{OUT}$, and to the degeneration inductor, $L_{DEG}$, via the low side node, $CAS_{LS}$.

Figure 6C:
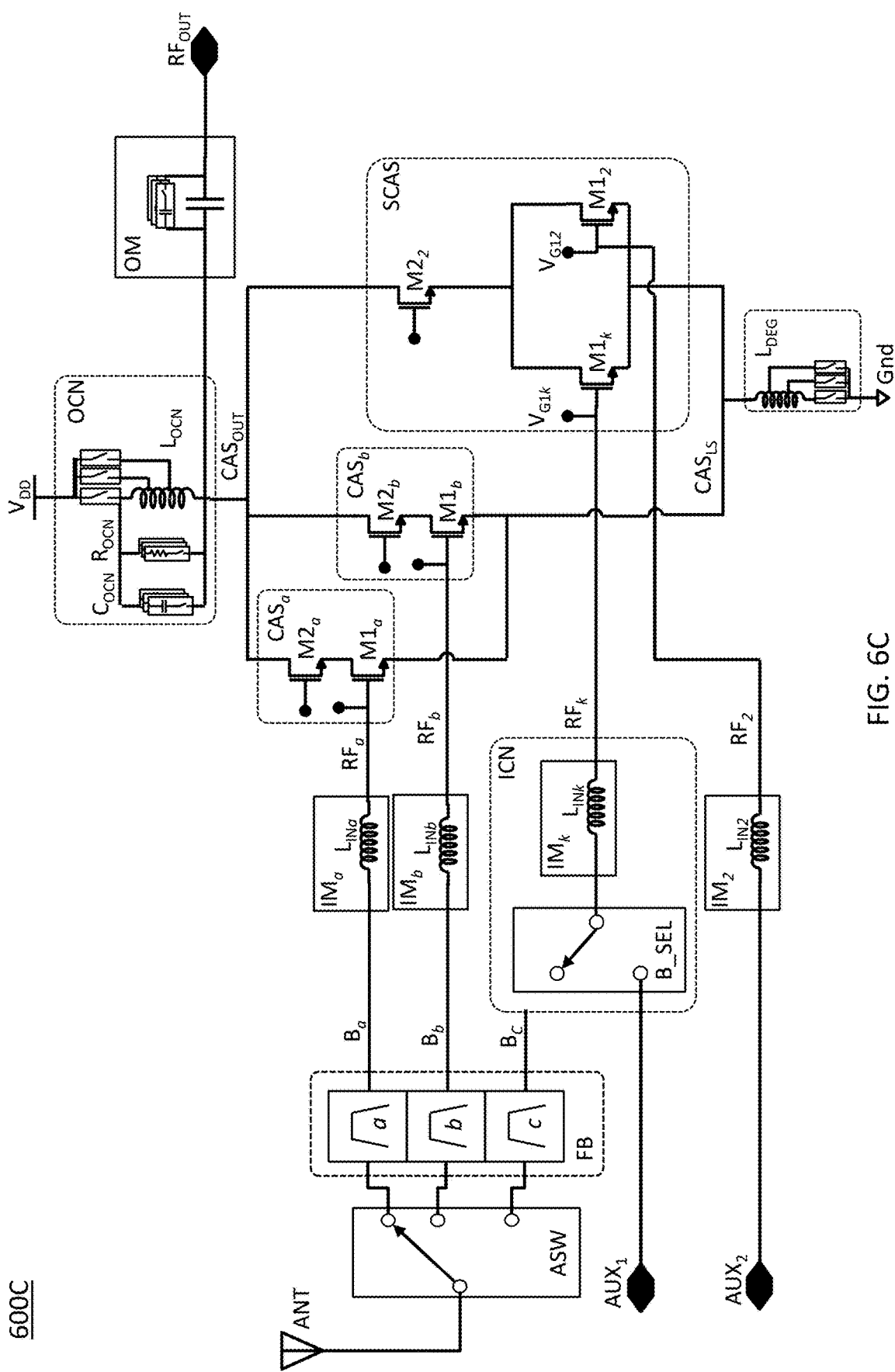
FIG. 6C shows the simplified schematic of the hybrid input RFFE architecture of FIG. 6B with added details related to coupling to an antenna.

With continued reference to FIG. 6B, amplification of the RF signals (e.g., $RF_a, RF_b, \ldots, RF_k, RF_2$) associated to the supported frequency bands (e.g., $B_a, B_b, \ldots, B_k, AUX_1, AUX_2$) may be provided via a multi-input single-output cascode low noise amplifier (e.g., $CAS_a, CAS_b$, SCAS, operating as an LNA) comprising a combination of stacked transistors (e.g., $M1_a, M1_b, M1_k, M1_2, M2_a, M2_b, M2_2$) that include input transistors (e.g., $M1_a, M1_b, M1_k, M1_2$) coupled to corresponding output cascode transistors (e.g., $M2_a, M2_b, M2_2$). As can be seen in FIG. 6C, RF signals (e.g., $RF_a, RF_b$) corresponding to tier one frequency bands (e.g., $B_a, B_b$) are amplified via input transistors (e.g., $M1_a, M1_b$) coupled to respective output cascode transistors (e.g., $M2_a, M2_b$) of the multi-input single-output amplifier ($CAS_a, CAS_b$, SCAS). On the other hand, RF signals (e.g., $RF_k, RF_2$) corresponding to tier two or three frequency bands (e.g., $B_c, AUX_1, AUX_2$) are amplified via input transistors (e.g., $M1_k, M1_2$) coupled to a single output cascode transistor (e.g., $M2_2$) of the multi-input single-output amplifier ($CAS_a, CAS_b$, SCAS). In other words, amplification of the tier one frequency bands (e.g., $B_a, B_b$) is provided via dedicated output cascode transistors (e.g., $M2_a, M2_b$), whereas amplification of the tier two or three frequency bands (e.g., $B_c, AUX_1, AUX_2$) is provided via a shared output cascode transistor (e.g., $M2_2$).

FIG. 6C shows the simplified schematic of the hybrid input RFFE architecture of FIG. 6B with added details related to coupling to an antenna, ANT, via an antenna switch, ASW, as described above with reference to FIG. 1A. An RF signal corresponding to each of the frequency bands (e.g., $B_a, B_b, B_c$) is received at the antenna, ANT, and is selectively routed through a respective filter (e.g., a, b, c) of a filter bank, FB, via the antenna switch, ASW. As understood by a person skilled in the art, the filters (e.g., a, b, c) may be of a variety of different types known in the art with performance characteristics, including insertion loss, that may be based on the type and/or a (bandpass) frequency range of a filter. In other words, the filters (a, b, c) associated to the frequency bands ($B_a, B_b, B_c$) may have different RF performances which may impact sensitivity provided by the corresponding RF processing paths at different degrees. Accordingly, information about quality of the filters (e.g., a, b, c) used for processing of the frequency bands (e.g., $B_a, B_b, B_c$) may be used to assign a performance priority to the frequency bands. In the exemplary configuration (600C) shown in FIG. 6C, over-the-air frequency bands ($B_a, B_b$) may be processed by filters (a, b) that may have a lower insertion noise performance (e.g., higher insertion loss) compared to the filter c used for processing the over-the-air band, $B_c$. Accordingly, since the filters (a, b) may consume a larger portion of an available sensitivity budget of corresponding RF processing paths compared to the filter c, a higher performance priority (e.g., tier one) may be assigned to the frequency bands ($B_a$, $B_b$), and a lower performance priority (e.g., tier three) may be assigned to the frequency band, $B_c$. Accordingly, teachings according to the present disclosure may include equalization of sensitivity across the supported frequency bands at a lower possible cost (e.g., via usage of shared input matchings circuits and/or shared cascode configurations when possible).

With continued reference to FIG. 6C, auxiliary frequency bands ($AUX_1$, $AUX_2$) may include different frequency ranges of operation. These may include, for example, a narrow frequency range (e.g., single-band) similar to one of the over-the-air frequency bands ($B_a$, $B_b$, $B_c$), or a broader/wider frequency range (e.g., multi-band) which accordingly may require special care in a corresponding input matching circuit. Furthermore, such auxiliary frequency bands may be pre-conditioned and therefore may not be processed by filters as shown in FIG. 6C. Because $AUX_1$ and $AUX_2$ are not processed by a filter, they may not be subjected to a corresponding filter insertion loss, and therefore such signals may be assigned a lower performance priority (e.g., tier two or three). Assuming that $AUX_1$ includes a narrow frequency range of operation and $AUX_2$ a broader frequency range of operation, then as shown in FIG. 6C, $AUX_1$ may be processed via the shared input matching circuit, $IM_k$, of the input combiner network, ICN, whereas $AUX_2$ may be processed via a dedicated input matching circuit, $IM_2$ (that may include, for example, an adjustable inductor, $L_{IN2}$). In other words, a medium performance priority (e.g., tier two) may be assigned to $AUX_2$, and a lowest performance priority (e.g., tier three) may be assigned to $AUX_1$. Accordingly, (a priori) assignment of the performance priority to a specific frequency band may not be solely based on band-specific elements (e.g., filters a, b, c), but may also be based on information about spectral content of the frequency band, and/or any other band specific parameter that may impact processing of a corresponding RF signal.

Figure 7:
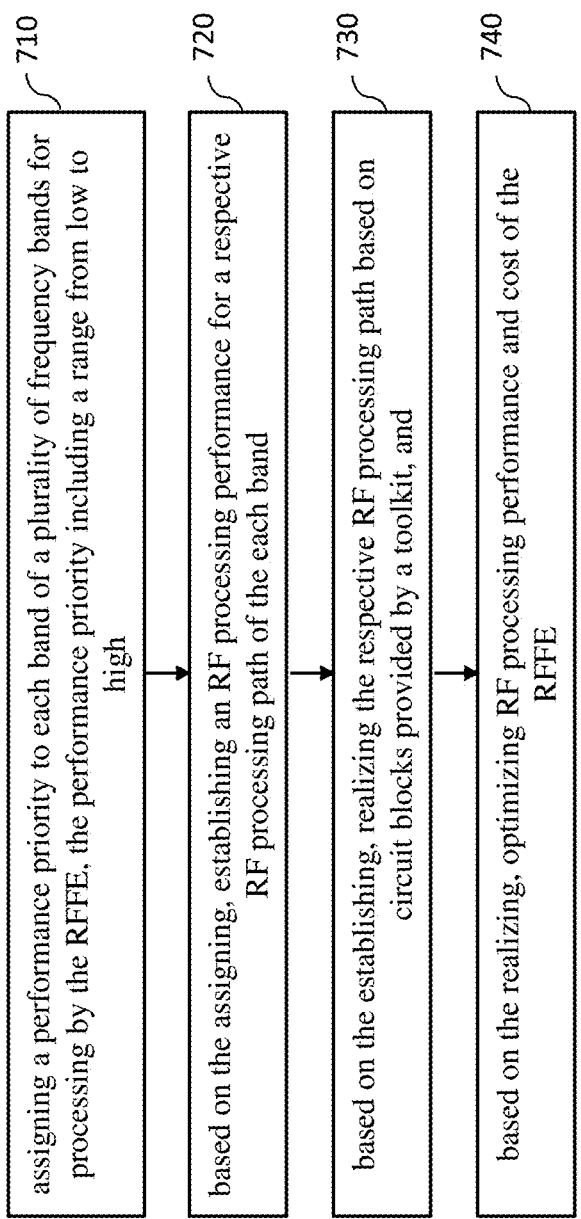
FIG. 7 shows various process steps of a method according to the present disclosure for optimizing performance and cost of a receive side of an RF front end (RFFE).

FIG. 7 is a process chart (700) showing various steps of a method according to the present disclosure for optimizing performance and cost of a receive side of an RF front end (RFFE). As can be seen in the process chart (700, such steps include: assigning a performance priority to each band of a plurality of frequency bands for processing by the RFFE, the performance priority including a range from low to high, per step (710); based on the assigning, establishing an RF processing performance for a respective RF processing path of the each band, per step (720); based on the establishing, realizing the respective RF processing path based on circuit blocks provided by a toolkit, per step (730); and based on the realizing, optimizing RF processing performance and cost of the RFFE, per step (740).

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A multi-input multi-band low noise amplifier (LNA) comprising:
a dedicated RF processing path comprising a dedicated cascode amplifier comprising a dedicated input transistor and a dedicated output cascode transistor that is coupled to a high side node;
a multi-input shared cascode amplifier comprising a plurality of input transistors and a shared output cascode transistor coupled to the plurality of input transistors, the shared output cascode transistor being coupled to the high side node and the high side node being coupled to a supply voltage through a tunable inductor;
a shared RF processing path for processing of at least two respective frequency bands, the shared RF processing path comprising an input band selection switch configured to selectively couple an input RF signal of each of the at least two respective frequency bands to a shared input transistor of the plurality of input transistors;
wherein the high side node is further coupled to the supply voltage through at least a resistor or a capacitor.

2. The multi-input multi-band low noise amplifier (LNA) of claim 1, wherein:
the dedicated RF processing path further comprises a dedicated input matching circuit coupled to the dedicated input transistor of the dedicated cascode amplifier, and
the shared RF processing path further comprises a shared input matching circuit coupled between the input band selection switch and the shared input transistor of the multi-input shared cascode amplifier.

3. The multi-input multi-band low noise amplifier (LNA) of claim 1, further comprising:
an additional RF processing path for processing of a respective frequency band, the additional RF processing path comprising:
a dedicated input matching circuit coupled to a dedicated input transistor of the plurality of input transistors of the multi-input shared cascode amplifier.

4. The multi-input multi-band low noise amplifier (LNA) of claim 1, wherein:
the dedicated output cascode transistor is unconditionally coupled to the high side node, and
the shared output cascode transistor is selectively coupled to the high side node via a switch.

5. The multi-input multi-band low noise amplifier (LNA) of claim 3, wherein:
processing of the respective frequency bands via the dedicated, shared and additional RF processing paths is based on a priori assignment of a performance priority to each band of said frequency bands.

6. The multi-input multi-band low noise amplifier (LNA) of claim 5, wherein:
the a priori assignment of the performance priority to each band of the said frequency bands is based on at least one of:
insertion loss of a band filter used to process a corresponding RF signal,
frequency spectrum of the each band, or
a target sensitivity performance for the each band.

7. The multi-input multi-band low noise amplifier (LNA) of claim 5, wherein:
the RF processing performance is based on at least one of:
an insertion loss performance,
a sensitivity performance,
a linearity performance, or
a power consumption performance.

8. The multi-input multi-band low noise amplifier (LNA) of claim 7, wherein:
the a priori assignment of the performance priority is configured to equalize an RF processing performance of the each band through the multi-input multi-band LNA with a reduced cost and physical size of said LNA.

9. The multi-input multi-band low noise amplifier (LNA) of claim 7, wherein:
the a priori assignment of the performance priority is configured to equalize an RF sensitivity performance of said frequency bands through the multi-input multi-band LNA with a reduced cost and physical size of said LNA.

10. The multi-input multi-band low noise amplifier (LNA) of claim 1, wherein:
a source of the dedicated output cascode transistor is coupled to a drain of the dedicated input transistor of the dedicated cascode amplifier, and
a source of the shared output cascode transistor is coupled to respective drains of the plurality of input transistors of the multi-input shared cascode amplifier.

11. The multi-input multi-band low noise amplifier (LNA) of claim 10, wherein:
respective sources of the dedicated input transistor of the dedicated cascode transistor and of the plurality of input transistors of the multi-input shared cascode amplifier are coupled to a low side node.

12. The multi-input multi-band low noise amplifier (LNA) of claim 11, wherein:
the low side node is coupled to a reference ground through a degeneration inductor.

13. The multi-input multi-band low noise amplifier (LNA) of claim 12, wherein:
the degeneration inductor is tunable.

14. The multi-input multi-band low noise amplifier (LNA) of claim 1, wherein:
the high side node is further coupled to a load through an output matching circuit.

15. The multi-input multi-band low noise amplifier (LNA) of claim 14, wherein:

the output matching circuit comprises at least one capacitor.

16. The multi-input multi-band low noise amplifier (LNA) of claim 15, wherein:
the at least one capacitor is tunable.

17. The multi-input multi-band low noise amplifier (LNA) of claim 2, wherein:
each of the dedicated input matching circuit and the shared input matching circuit comprises an inductor.

18. The multi-input multi-band low noise amplifier (LNA) of claim 17, wherein:
the inductor of the each of the dedicated input matching circuit and the shared input matching circuit is a fixed inductance surface mount device.

19. The multi-input multi-band low noise amplifier (LNA) of claim 3, wherein:
the dedicated input matching circuit of the additional RF processing path comprises an inductor.

20. The multi-input multi-band low noise amplifier (LNA) of claim 19, wherein:
the inductor of the dedicated input matching circuit of the additional RF processing path is a surface mount device with tunable inductance.

21. The multi-input multi-band low noise amplifier (LNA) of claim 19, wherein:
the inductor of the dedicated input matching circuit of the additional RF processing path is an in-circuit inductor.

\* \* \* \* \*